United States Patent
Miyawaki

[11] Patent Number: 5,808,336
[45] Date of Patent: Sep. 15, 1998

[54] STORAGE DEVICE

[75] Inventor: Mamoru Miyawaki, Isehara, Japan

[73] Assignee: Canon Kabushiki Kaisha, Tokyo, Japan

[21] Appl. No.: 435,803

[22] Filed: May 5, 1995

[30] Foreign Application Priority Data

May 13, 1994 [JP] Japan .................................. 6-099708

[51] Int. Cl.⁶ .................................................. H01L 29/788
[52] U.S. Cl. .............................. 257/315; 257/369; 257/80
[58] Field of Search .................................... 257/316, 369, 257/390, 411, 678, 80

[56] References Cited

U.S. PATENT DOCUMENTS

| | | | |
|---|---|---|---|
| 3,422,321 | 1/1969 | Tombs | 257/411 |
| 4,332,077 | 6/1982 | Hsu | 29/571 |
| 5,200,636 | 4/1993 | Usemura et al. | 257/315 |
| 5,331,197 | 7/1994 | Miyawaki et al. | 257/530 |
| 5,420,756 | 5/1995 | Katsumata et al. | 257/777 |
| 5,493,139 | 2/1996 | Akiyama et al. | 257/67 |

FOREIGN PATENT DOCUMENTS

| | | |
|---|---|---|
| 0089547 | 9/1983 | European Pat. Off. . |
| 0244530 | 11/1987 | European Pat. Off. . |
| 0510607 | 10/1992 | European Pat. Off. . |
| 51-147135 | 12/1976 | Japan . |
| 62-49651 | 3/1987 | Japan . |
| 62-188620 | 8/1987 | Japan . |

OTHER PUBLICATIONS

IEEE Electron Device Letters, vol. 13, No. 1, Jan. 1992 New York, USA, pp. 53–55, XP 000240817, Kueing–Long Chen et al., "A Sublithographic Antifuse Structure for Field–Programmable Gate Array Applications".

Primary Examiner—Mark V. Prenty
Attorney, Agent, or Firm—Fitzpatrick, Cella, Harper & Scinto

[57] ABSTRACT

A storage device comprises, on a substrate, a first semiconductor region of one conductivity type, second and third semiconductor regions of a conductivity type opposite to the one conductivity type contiguous to the first semiconductor region, a first electrode which is formed on a region for isolating the second and third semiconductor regions via an insulating layer, and a second electrode formed on the first electrode, but spaced therefrom by an insulating layer. The resistance between the first and second electrodes is selectively changed from a high-resistance state to a low-resistance state is needed, to record a bit of data.

67 Claims, 18 Drawing Sheets

STORAGE DEVICE

BACKGROUND OF THE INVENTION

1. Field of the Invention

The present invention relates to a storage device and, more particularly, to a storage device using a semiconductor.

2. Related Background Art

In recent years, along with the development of information/video industries, media and devices for storing information have been extensively developed. Of these media and devices, storage devices such as DRAMs, SRAMs, and the like have large storage capacities even though they have compact, lightweight, and low-power structures, and allow high-accuracy read/write operations at high speed. For these reasons, these devices are used in equipment in various fields.

Also, recently, a storage device, a so-called flash memory, which is programmable and can hold information, has received a lot of attention. This storage device is superior to the DRAM in terms of the degree of integration.

On the other hand, an OT-PROM (one time PROM) in which information can be written only once has been proposed in Japanese Laid-Open Patent Application No. 62-188260 (inventor: Levi Gersburg (phonetic)) and Japanese Laid-Open Patent Application No. 62-49651 (inventors: Brian E. Cook, Douglas P. Berlet (phonetic)). In the arrangement of the OT-PROM, a wiring metal is connected in series with a main electrode (the source or drain for a MOSFET; the emitter for a bipolar transistor) of a transistor via an a-Si layer. By changing the a-Si layer from a high-resistance state to a low-resistance state, a storage operation is achieved.

However, a storage device such as a DRAM using a semiconductor has the following problems.

1. Semiconductor storage devices like DRAMs and SRAMs suffer from a high rate of chip cost increase with any increase in storage capacity, and also suffer from a higher bit cost than those of floppy disks, magnetic tapes, and CD-ROMs. For these reasons, such a storage device cannot be used practically as a storage medium.
2. At present, the storage capacity is at the 256-Mbit level even at the research level, which is insufficient information volume for images.
3. When information is stored in a DRAM or SRAM, the DRAM or SRAM must be kept supplied with a power supply voltage, and it is therefore difficult to use such circuits in portable equipment. Under these circumstances, a battery built-in device is used in such equipment.

On the other hand, the flash memory, which is superior to the DRAM and like in terms of the degree of integration also has the following problems.

1. Since a charge is written in or erased from a floating gate by injection of an FN tunnel current, hot electrons, or the like, the reliability of the insulating layer which is subjected to a charge as the number of times of use increases.
2. The FN tunnel current density, J, is expressed by:

$$J = \alpha E^2 \exp(-\beta/E) \quad (1)$$

where E is the electric field to be applied to the insulating layer, and $\alpha$ and $\beta$ are constants. From equation (1), a large current flows when the electric field strength is large. However, as the floating gate potential changes, the current decreases exponentially. Therefore, the write or erase time per bit is as long as about 100 $\mu$s to 10 ms, resulting in poor operability of the storage device.

3. The FN tunnel current strongly depends on the film quality and thickness of the insulating film, and the proper write or erase time undesirably varies among samples and bits. For this reason, in practice, after chips are manufactured, the chips are classified into groups in an inspection process, and are operated at timings suitable for these groups. Thus, the load on the inspection process is heavy, resulting in high cost.
4. As the storage capacity increases, the floating gate area decreases. For this reason, the floating gate capacity decreases proportionally, and the floating gate potential changes considerably due even to a small leakage current. Therefore, in order to assure a desired capacity, an affordable reduction in floating gate area is limited, and this limitation interferes with the need to increase capacity.

Furthermore, the OT-PROM in which information can be written only once is excellent in that its state after information is written never changes and is stable. However, the OT-PROM requires an a-Si layer and a contact area between the a-Si layer and a wiring layer for each bit. In a semiconductor process, formation of contact holes is difficult to achieve as compared to formation of line patterns. Even if a 0.8-$\mu$m rule process is used, the contact size is on the 1-$\mu$m$^2$ order which is about 20% larger than 0.8 $\mu$m. Since wiring width must be larger than each contact hole, the area per bit cannot be reduced. For these reasons, it is difficult to realize a large storage capacity in the proposed memories. Also, since a large current flows through the a-Si layer in a write operation, the consumption of power is high, and it is difficult to apply such a memory to portable equipment.

SUMMARY OF THE INVENTION

It is an object of the present invention to provide a storage device which can solve the above-mentioned technical problems, and can realize a large capacity, low cost, write enable, high read/write speed, high reliability, and low consumption power.

The above-mentioned object can be realized by the following device.

In a first storage device of the present invention, which comprises, on a substrate, a first semiconductor region of one conductivity type, second and third semiconductor regions of a conductivity type opposite to the one conductivity type, which are contiguous to the first semiconductor region, a first electrode which is formed on a region for isolating the second and third semiconductor regions via an insulating layer, and a second electrode formed on the first electrode "but spaced therefrom by an insulating layer, a resistance between the first and second electrodes is changed from a high-resistance state to a low-resistance state.

In a further aspect of the present invention, the change in resistance is attained by a voltage to be applied to the second electrode.

In another aspect of the invention, a plurality of such storage devices are arranged, and the i-th second or third semiconductor regions and (i+1)-th third or second semiconductor regions of the plurality of storage devices are electrically connected to each other.

In still another aspect of the present invention, a plurality of such storage devices are arranged, the second semiconductor regions of the plurality of storage devices are connected to each other, and the third semiconductor regions thereof are connected to each other.

In still another aspect of the present invention, the substrate comprises a substrate which has an Si layer on an insulating layer.

In yet another aspect of the present invention, several such storage devices are arranged in a matrix, a line for commonly connecting the second electrodes in one direction of arrays is arranged, the first semiconductor regions of the storage devices arranged in a direction perpendicular to the line are commonly connected, and the first semiconductor regions in the respective arrays are electrically isolated from each other.

In still another aspect of the present invention, an opposing area between the first electrode and a semiconductor region having the first, second, and third semiconductor regions is larger than an opposing area of the second electrode and the first electrode.

In yet another aspect of the present invention, the first electrode has at least two opposing portions which sandwich the first semiconductor region therebetween.

In yet another aspect of the present invention, the first electrode consists of a material containing poly-Si.

In still another aspect of the present invention, an insulating layer between a semiconductor region including the first, second, and third semiconductor regions, and the first electrode comprises a film consisting of Si, N, and 0.

In yet another aspect of the present invention, the storage device comprises a storage device with a different structure in a portion thereof.

In another aspect of the present invention, a peripheral circuit of the storage device comprises a CMOS circuit.

In another aspect of the present invention, the storage device is mounted on a card.

In another aspect of the present invention, the first and second electrodes are arranged in a matrix, and a region for changing a resistance between the first and second electrodes on each intersection of the matrix from a high-resistance state to a low-resistance state is arranged.

In another aspect of the present invention, a plurality of the storage devices are arranged, the first semiconductor region of a storage device in which information is written is connected to a desired power supply, and the first semiconductor region of a storage device in which no information is written is set in a floating state.

In another aspect of the present invention, a first voltage $V_1$ to be applied to the second electrode when information is written in the storage device is higher than a second voltage $V_2$ to be applied to the second electrode when information is read out from the storage device.

In another aspect of the present invention, a semiconductor region having an impurity concentration higher than an impurity concentration of the first semiconductor region is arranged in contact with the first semiconductor region.

In still another aspect of the present invention, data to be written is written in the storage device and the storage device with the different structure, the written data are read out from the two storage devices, and the two readout results are collated to each other.

In another aspect of the present invention, a circuit having a plurality of gate electrodes via floating gates is arranged in at least a portion of the peripheral circuit.

In still another aspect of the present invention, is characterized in that, in the 13th storage device, the card comprises a read-only storage device.

In yet another aspect of the present invention, is characterized in that, in the 13th storage device, the card comprises a light-emitting element and a light-receiving element.

In yet another aspect of the present invention, in the 15th storage device, the following relations are satisfied:

$$\frac{C_{FG}}{C_{FG}+C_{CG}} V_1 \geq V_{BD}$$

$$\frac{C_{CG}}{C_{FG}+C_{CG}} V_2 < V_{th}$$

$$V_2 > V_{th}$$

where $V_{BD}$ is the voltage across the first and second electrodes when the resistance between the first and second electrodes changes from a high-resistance state to a low-resistance state, $V_{th}$ is the threshold value of an insulating gate transistor formed when the second and third semiconductor regions are assumed to be main electrode regions, the first semiconductor region is assumed to be a control electrode region, and the first electrode is assumed to be a control electrode, $C_{FG}$ is the capacitance formed between the first electrode, and the first, second, and third semiconductor regions, and $C_{CG}$ is the capacitance formed between the first and second electrodes.

In still another aspect of the present invention, in the 18th storage device, a region in which the collation result is written is arranged in the storage device.

According to the present invention, since an ON current of a transistor does not flow via an anti-fuse unlike in a conventional anti-fuse ROM, an operation error caused by heat can be prevented, and high reliability can be guaranteed.

DETAILED DESCRIPTION OF THE PREFERRED EMBODIMENTS

According to one preferred aspect of the present invention, second and third semiconductor regions of a second conductivity type are formed via a first semiconductor region of a first conductivity type, and a gate electrode structure is formed. Furthermore, the gate electrode is designed to have a structure having two stacked gate electrodes. In addition, by utilizing the difference between the resistances of the stacked gate electrodes, information is stored.

An insulating gate transistor which has the first semiconductor region as a channel, and the second and third semiconductor regions as a source and drain is preferably used.

When the transistors are arranged in a matrix as needed, a large-capacity memory can be realized.

As will be described later, by improving the structure of the transistor, the structure of the stacked gate electrode, and the like, the device performance can be further improved.

The preferred embodiments of the present invention will be described in detail hereinafter with reference to the accompanying drawings.

First Embodiment

Figure 1:
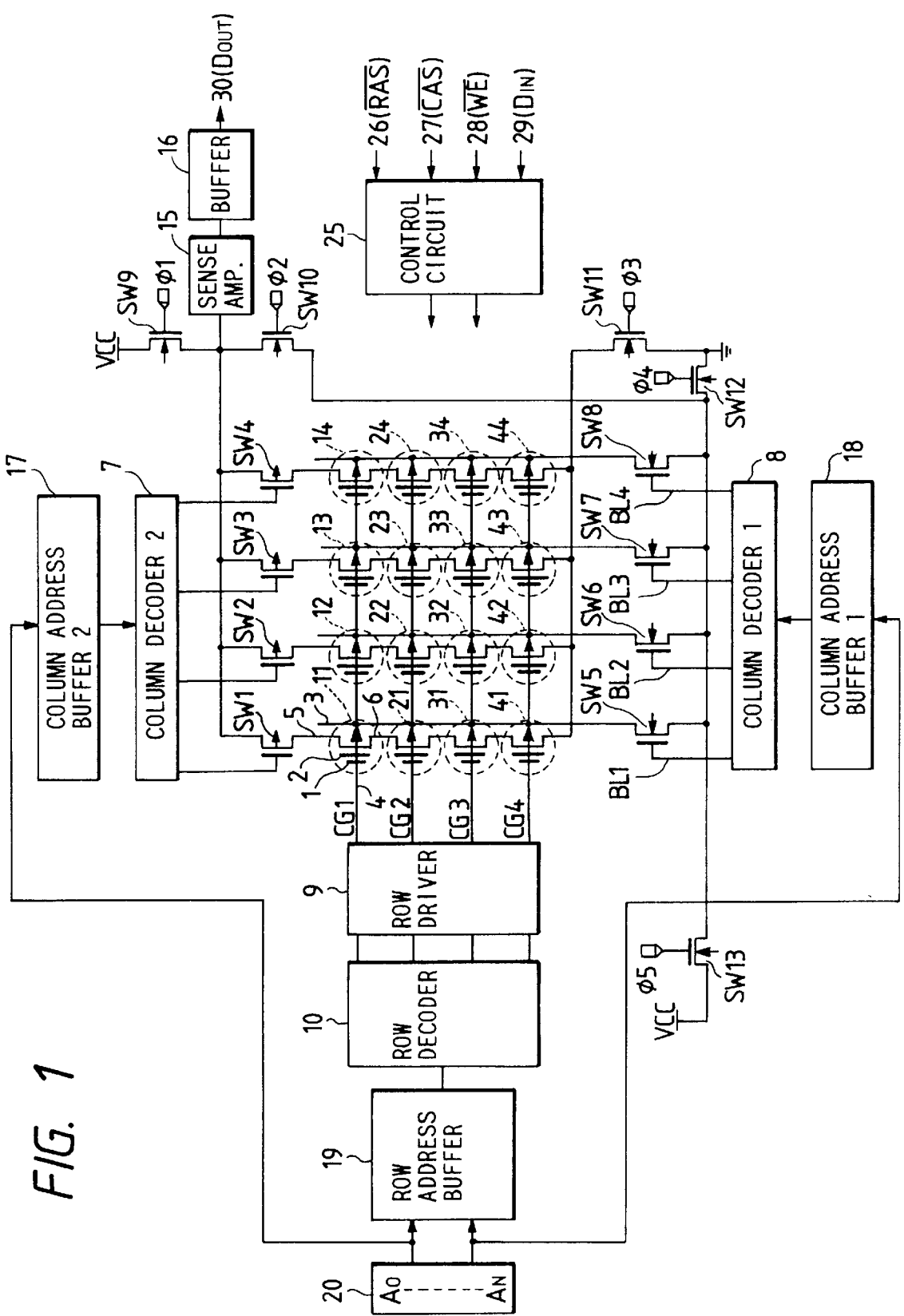
FIG. 1 is a circuit diagram showing the circuit arrangement of a storage device according to the present invention.

FIG. 1 shows an equivalent circuit of fundamental blocks of a storage device according to the present invention. The circuit shown in FIG. 1 has memory cells 11, 12, 13, 14, 21, 22, 23, 24, 31, 32, 33, 34, 41, 42, 43, and 44, and this embodiment exemplifies a 4×4 cell structure for the sake of simplicity (note that the detailed structure of each cell will be described in detail later).

Each memory cell has a control gate 1 (serving as a second electrode), a floating gate 2 (serving as a first electrode), a well layer 3 (serving as a first semiconductor region) of a MOSFET, and source and drain portions 5 and 6 (serving as second and third semiconductor regions) of the MOSFET. The control gates of the memory cells of each row are connected via a word line 4. The sources and drains of the cells are connected in series with each other in units of columns. These cells are connected to a column decoder 7 as means for selecting a read column, a column decoder 8 as means for selecting a write bit line, a row driver 9 for driving a word line, a row decoder 10 for selecting a word line, a sense amplifier 15, and a buffer amplifier 16. Column address buffers 17 and 18 supply address inputs 20 to the column decoders 7 and 8. Switches SW1 to SW13 comprise MOSFETs. Of these switches, the switches SW9, SW10, SW11, and SW13 are ON/OFF-controlled by pulses $\phi1$, $\phi2$, $\phi3$, $\phi4$, and $\phi5$. The circuit receives a row address strobe signal ($\overline{RAS}$) 26, a column address strobe signal ($\overline{CAS}$) 27, a write enable signal ($\overline{WE}$) 28, and an input data signal ($D_{IN}$) 29, and outputs an output data signal ($D_{OUT}$) 30. Note that $\overline{RAS}$, $\overline{CAS}$, and $\overline{WE}$ are shown in FIG. 1.

The operation of this storage device will be described below. In this device, two different address signals are time-divisionally input from a single input pin. After the column address is determined, the $\overline{CAS}$ signal 27 changes from high level to low level to fetch the column address into a chip. After the row address is determined, the $\overline{RAS}$ signal 26 changes from high level to low level to fetch the row address into the chip. With this control, the number of address pins can be halved. Whether the chip is in a read or write mode is determined depending on high or low level of the $\overline{WE}$ signal 28.

In the read mode, after the lapse of a predetermined period of time from the change in the $\overline{RAS}$ signal, significant output data is obtained from a $D_{OUT}$ terminal 30. In the write mode, data is written from a $D_{IN}$ terminal 29.

Figure 2:
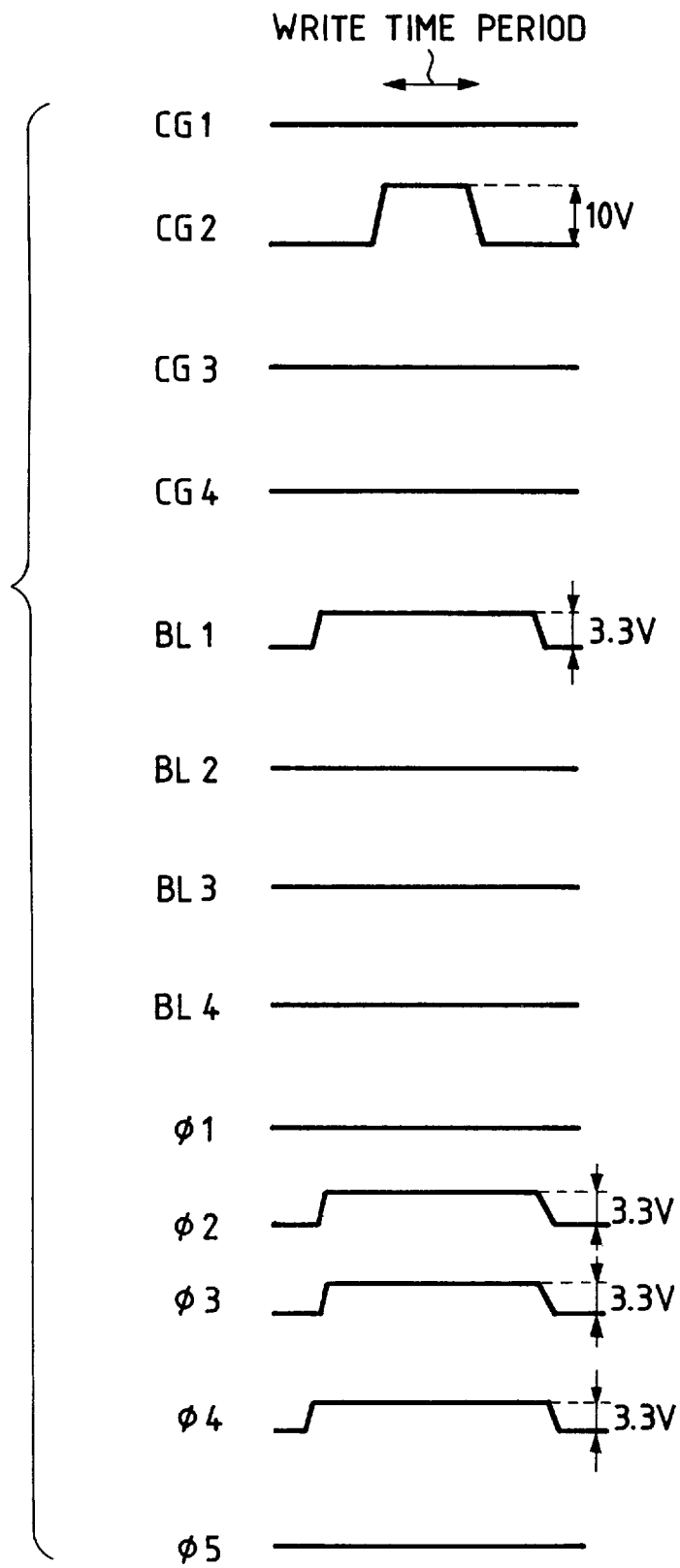
FIG. 2 is a timing chart showing the write operation according to the first embodiment of the present invention.

The write operation will be described in detail below with reference to the timing chart shown in FIG. 2. The power supply voltage of this chip is set to be 3.3 V to achieve low power consumption. In FIG. 2, CG1, CG2, CG3, and CG4 represent the first, second, third, and fourth word line potentials in FIG. 1. Also, BL1, BL2, BL3, and BL4 represent the pulses respectively input to the switches SW5 to SW8 as n-MOSFETs. FIG. 2 exemplifies pulses generated when information is written in the cell 21 in the storage device of this embodiment. Before the write operation, column decoder 8 respectively sets the pulses BL1, BL2, BL3, and BL4 at high level, low level, low level, and low level, thereby setting the switch SW5 in an ON state, and setting other switches SW6, SW7, and SW8 in an OFF state. In this state, the well potential of the first column having a write target cell is held at the GND level as the low-potential reference voltage, and the well potentials of the remaining second to fourth columns are set in a floating state.

On the other hand, the switches SW9, SW10, SW11, SW12, and SW13 also comprise n-type MOSFETs, and pulses $\phi1$, $\phi2$, $\phi3$, $\phi4$, and $\phi5$ are respectively set at low level, high level, high level, high level, and low level, as shown in FIG. 2. The switches SW1 to SW4 comprise p-type MOSFETs, and all pulses from column decoder 7 are set at low level, thereby holding the source and drain potentials of the respective cells at the GND potential as the low-potential reference voltage.

Then, the row driver 9 applies a pulse with an amplitude of 10 V to only a word line connected to the write target cell 21. In this case, although the power supply voltage is 3.3 V, since no current flows, a high voltage can be easily generated by a booster circuit in the chip. Upon application of this write pulse, a bias of about 6.6 V is applied across the control gate 1 and the floating gate 2 of the cell 21, and the resistance between the control gate 1 and the floating gate 2 changes from a high-resistance state to a low-resistance state in several tens of ns, thus completing the write operation. Even when the above-mentioned pulse is applied across the control gate and the floating gate of each of the cells 22, 23, and 24 connected to the same word line, since only a bias as low as about 0.1 to 0.5 V is applied across these gates, the resistance between the control gate and the floating gate of each cell remains in a high-resistance state. For this reason, no information is written in these cells. This is because the voltage is mainly applied to the well and the substrate and is not applied across the control gate and the floating gate since the switches SW6 to SW8 are set in an OFF state, and the well potentials of the second, third, and fourth columns are set in a floating state, as described above. After the completion of the write operation, the word line potential is reset to 0 V, as indicated by CG2 in FIG. 2.

As has been described above, the storage device of the present invention is a novel one since the gate structure of the transistor provided to each cell has a stacked structure of a floating gate and a control gate, and the storage device achieves the write operation by changing the resistance between the floating gate and the control gate (to a low resistance) by a pulse applied to the control gate.

Figure 3:
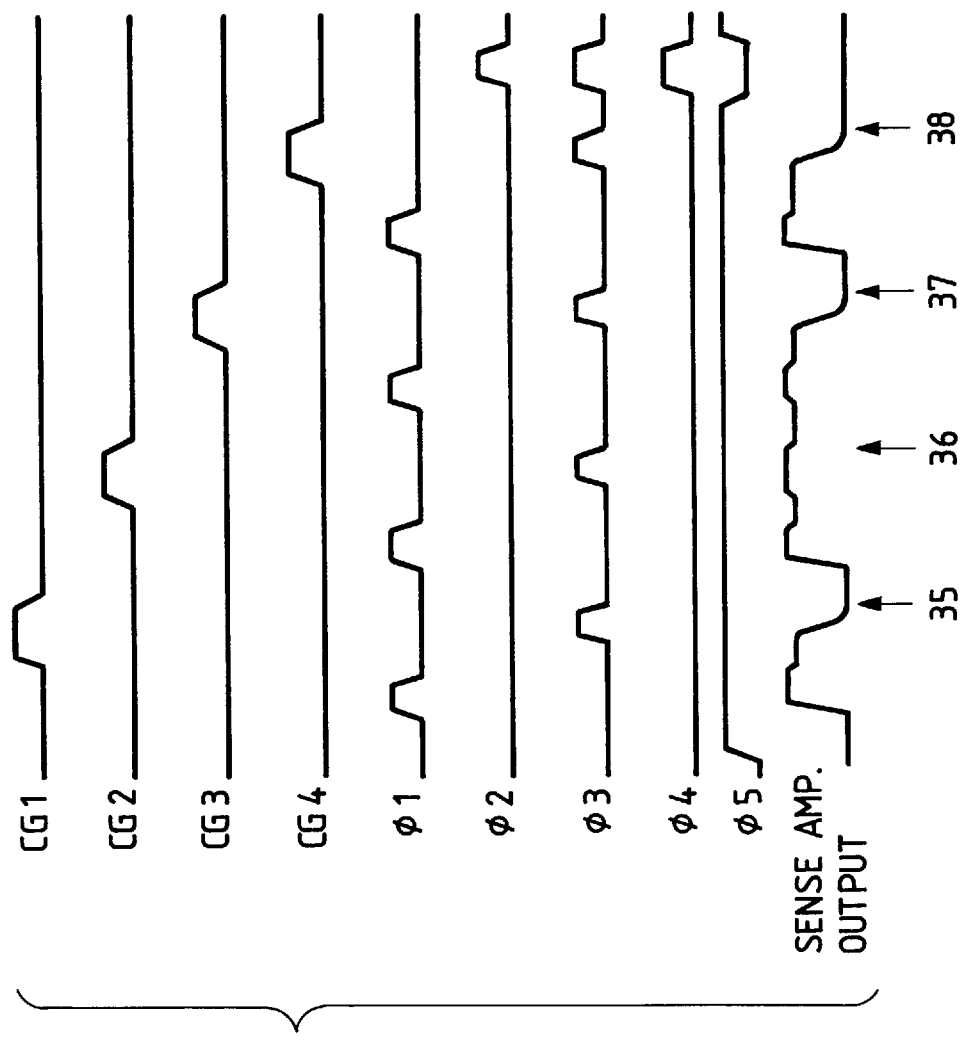
FIG. 3 is a timing chart showing the read operation according to the first embodiment of the present invention.

The read operation of the present invention will be described below with reference to the timing chart shown in FIG. 3. The transistors constituting the respective cells are assumed to be p-type MOSFETs, and their threshold value is set to be −1.8 V. In this embodiment, each cell portion is assumed to be a p-type MOSFET but may be an n-type MOSFET.

Assume that a column to be subjected to the read operation is the first column in FIG. 1, information has already been written in only the cell 21 in this column, and no information is written in other cells 11, 31, and 41.

In order to read out information from the first column, the column decoder-2 7 applies pulses for setting the transistor of only the switch SW1 in an ON state, and setting the transistors of other switches SW2, SW3, and SW4 in an OFF state to the gates of the switches. In the read operation, the switches SW12, SW13, and SW5 are set in OFF, ON, and ON states, so that the well potential of the column to be subjected to the read operation is fixed at the highest potential when the cell transistor is a PMOS. Needless to say, when the cell transistor is an NMOS, the fixed well potential is the lowest potential.

First, the pulse φ1 is set at high level to pre-charge the source-drain paths of the cells 11, 21, 31, and 41 to $V_{cc}$ level. This operation can be achieved when all the word lines are set at 0 V and the p-type MOSFETs of the respective cells are set in an ON state. The pulse φ1 is set at low level, and a pulse CG1 of an amplitude of 3.3 V is applied to a word line connected to the cell 11, as shown in FIG. 3, so as to read out information from the cell 11. Since no information is written in the cell 11, the floating potential is 1.1 V which is determined by dividing the capacitances of the control gate and the floating gate of the cell. As described above, the threshold value of the p-type MOSFET of this embodiment is set to be −1.8 V, and even when the above-mentioned pulse is applied, the p-type MOSFET of the cell 11 remains in an ON state. Therefore, when the pulse φ3 is applied, since all the p-type MOSFETs of the first column are in an ON state, the output from the sense amplifier 15 decreases, as indicated by 35 in FIG. 3, and it is determined that no information is written in the cell 11. Next, the pulse φ1 is applied again to pre-charge the cells, and thereafter, the pulse CG2 is set at high level to read out information from the cell 21. Since the pulse has an amplitude of 3.3 V, and information has already been written in the cell 21, the control gate and the floating gate of the cell 21 are connected to each other in a low-resistance state, and the pulse of 3.3 V is directly applied to the cell 21. Therefore, the p-MOSFET of the cell 21 is set in an OFF state. As a result, even when the pulse φ3 is applied, the sense amplifier output is kept at high level, as indicated by 36 in FIG. 3, and it is determined that information is written in the cell 21. By repeating the same operation, the outputs from the cells 31 and 41 are at low level, as indicated by 37 and 38 in FIG. 3, and no information is written in these cells.

After the read operation, the pulses φ2, φ3, and φ4 are set at high level, and the pulses φ1 and φ5 are set at low level, thereby setting not only the control gates of the cells but also the sources, drains, and the wells of them at 0 V. With this operation, the floating gate potential is stably reset to 0 V as an initial state, thus preventing an operation error. More specifically, in a standby state, all the sources, drains, control gates, and wells are set at 0 V, and even when a small leakage current flows through the floating gate, the gate is always automatically reset to 0 V, thus stabilizing the operation.

Note that a more stable write operation is assured if the following relations are satisfied:

$$\frac{C_{FG}}{C_{FG} + C_{CG}} V_1 \geq V_{BD}$$

$$\frac{C_{CG}}{C_{FG} + C_{CG}} V_2 < V_{th}$$

$$V_2 > V_{th}$$

where $V_{BD}$ is the voltage across the floating gate 2 and the control gate 1 when the resistance between them changes from a high-resistance state to a low-resistance state, $V_{th}$ is the threshold value of the MOSFET, $C_{FG}$ is the capacitance formed between the floating gate 2, and the source/drain region and the well region of the MOSFET, $C_{CG}$ is the capacitance formed between the floating gate 2 and the control gate 1, and $V_1$ and $V_2$ are the voltages to be applied to the control gate respectively in the write and read modes.

Figure 4:
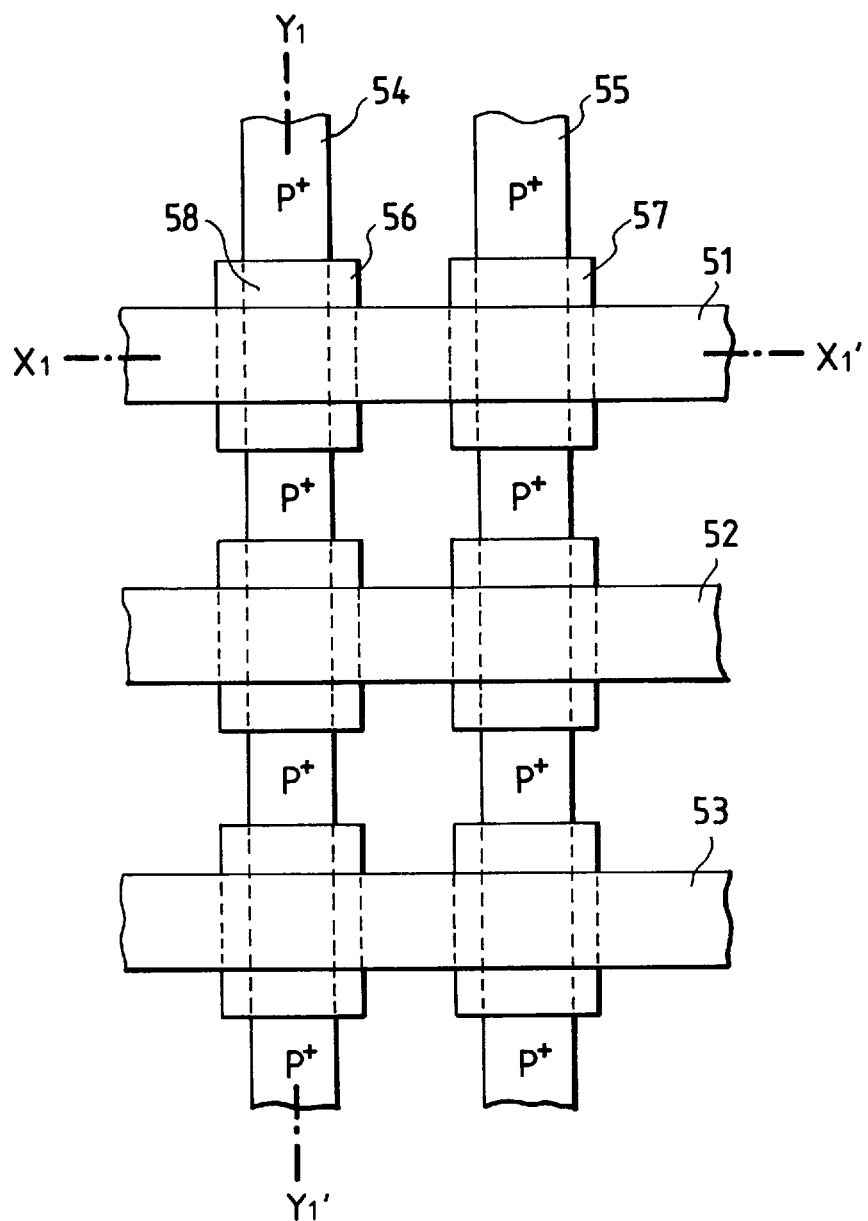
FIG. 4 is a plan view showing a cell portion according to the first embodiment of the present invention.
Figure 5A:
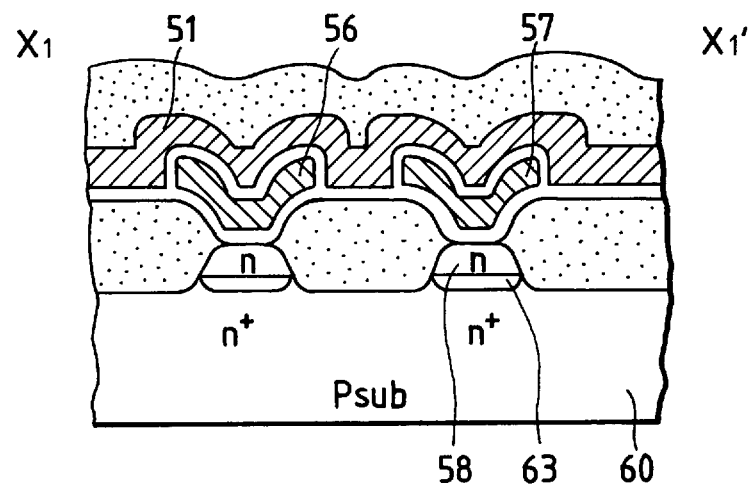
FIGS. 5A and 5B are sectional views showing the cell portion according to the first embodiment of the present invention.
Figure 5B:
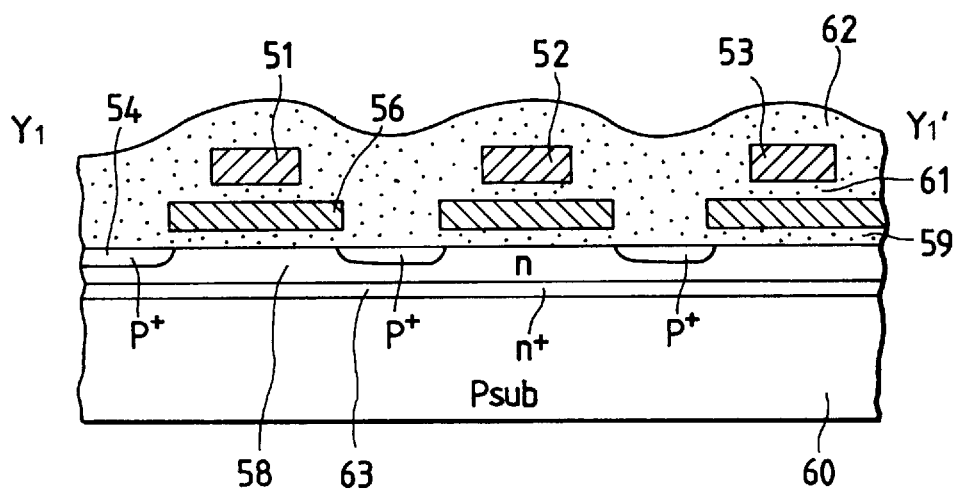

FIG. 4 is a plan view of the memory cell portion of the present invention. The cell portion comprises word lines 51, 52, and 53 consisting of poly-Si and W-polyside, $p^+$-type layers 54 and 55 which form the sources and drains of the p-type MOSFETs, floating gates 56 and 57 consisting of poly-Si, and channel portions 58 of the p-type MOSFETs. FIGS. 5A and 5B respectively show an $X_1$—$X_1$' section and a $Y_1$—$Y_1$' section of FIG. 4. The same reference numerals in FIGS. 5A and 5B denote the same parts as in FIG. 4, and a detailed description thereof will be omitted.

A gate insulating layer 59 for the p-type MOSFETs preferably consists of: a combination of a nitride film, and a thermal oxide film of Si or an oxide film formed by Lp-CVD to achieve a large capacity; a thermal oxynitride film formed in an atmosphere of $O_2$, $NH_3$, and $N_2O$; $Ta_2O_5$ with a high dielectric constant; or the like. In this embodiment, a 100-Å thick film with an effective dielectric constant of 5 was formed by combining an oxide film and a nitride film, and was used as the insulating film.

The cell portion also comprises a p-type substrate 60, and a high-concentration $n^+$-type layer 63 formed below the n-type well. When the number of p-type MOSFETs to be connected in series with each other is small, if the resistance of the n-type well is sufficient, the n$^+$-type layer 63 is not always required. An insulating layer 61 is formed between the floating gate and the control gate. In this embodiment, a 50-Å thick poly-Si film is formed to serve as the insulating film 61 by thermal oxidation of the floating gate. With this structure, the capacitance per unit area between the control gate and the floating gate is higher (about 1.5 times) than that between the floating gate and the lower Si layer. However, as can be seen from FIGS. 4 to 5B, the floating gate is formed to have an area larger than the overlapping area of the control gate and the floating gate, and the practical capacitance between the floating gate and the underlying Si layer is set to be higher than that between the control gate and the floating gate. Thus, a desired voltage is applied across the control gate and the floating gate upon application of a write pulse.

The method of manufacturing the structure according to the present invention will be described below with reference to FIGS. 6A to 6D. Note that the same reference numerals in FIGS. 6A to 6D denote the same parts as in FIGS. 4 to 5B.

Figure 6A:
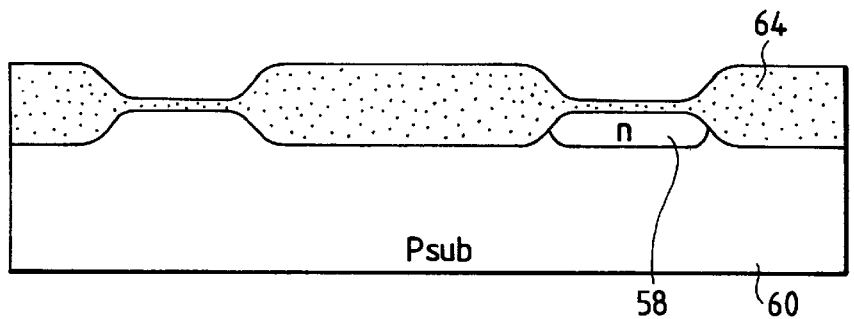
FIGS. 6A to 6D are sectional views showing the processes in the manufacturing method according to the first embodiment of the present invention.
Figure 6B:
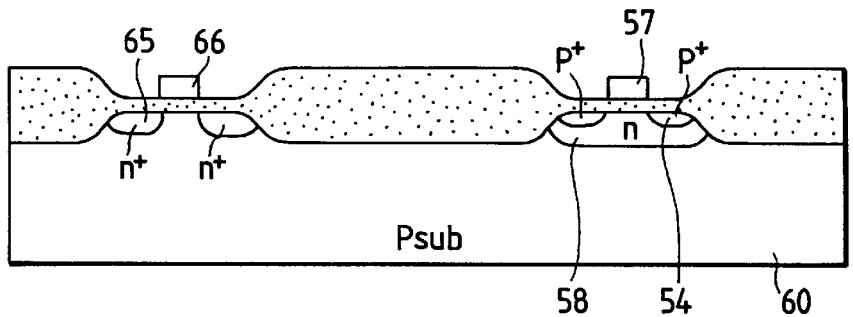

As the p-type Si substrate 60, a substrate having an impurity concentration of $10^{14}$ to $10^{17}$ cm$^{-3}$ can be used. In this case, in consideration of the width between wells to be divided, and the capacitance formed in each well, a substrate having an impurity concentration of $10^{16}$ cm$^{-3}$ is preferable. As shown in FIG. 6A, a field oxide film 64 for element isolation is formed by a selective oxidation or modified selective oxidation method (when an Si film is oxidized after a groove is formed in the Si film where a field oxide film is to be formed by etching, the bird's beak is narrowed, and the isolation width can be decreased). Thereafter, patterning for forming the n-type well 58 is performed, and a well having an impurity concentration about 2 to 7 times the substrate concentration is formed by ion implantation. In this case, in order to assure the withstand voltage between adjacent n-type wells, the depth of the well is level with the bottom level of the field oxide film 64, i.e., the well is considerably shallower than a conventional one. In the next step, as shown in FIG. 6B, an 85-Å thick thermal oxide film is formed by Wet oxidation at 750° C. to 1,100° C., and is subjected to a heat treatment in an NH$_3$ atmosphere at 950° C. to 1,100° C. for 90 seconds, and in an O$_2$ or N$_2$O atmosphere at 1,150° C. for 90 seconds, thus essentially forming an SiON film having a thickness of about 100 Å. Then, 4,000-Å thick poly-Si films 57 and 66 as the first layer are formed by Lp-CVD, and are subjected to ion implantation and annealing to dope an impurity in the poly-Si films. Thereafter, n$^+$-type layers 65 serving as the source and drain of the n-type MOSFET, and p$^+$-type layers 54 serving as the source and drain of the p-type MOSFET are formed. In order to relax electric fields at the source and drain terminals upon miniaturization, the n and p-MOSFETs preferably have LDD and Gate Drain Overlagged Lightly Dogged Drain ("GOLD") structures formed in low-temperature operations, respectively.

Figure 6C:
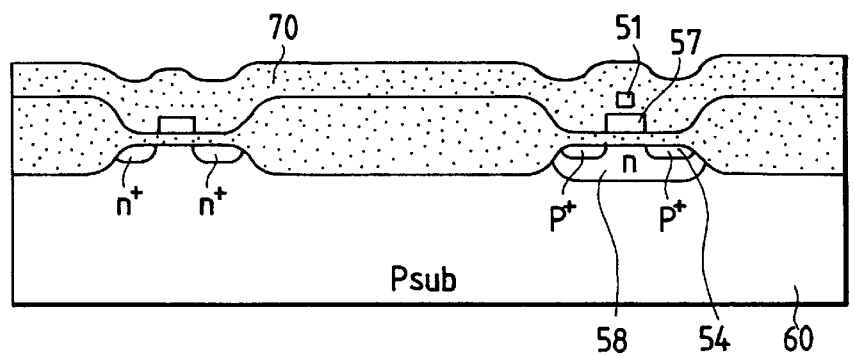
Figure 6D:
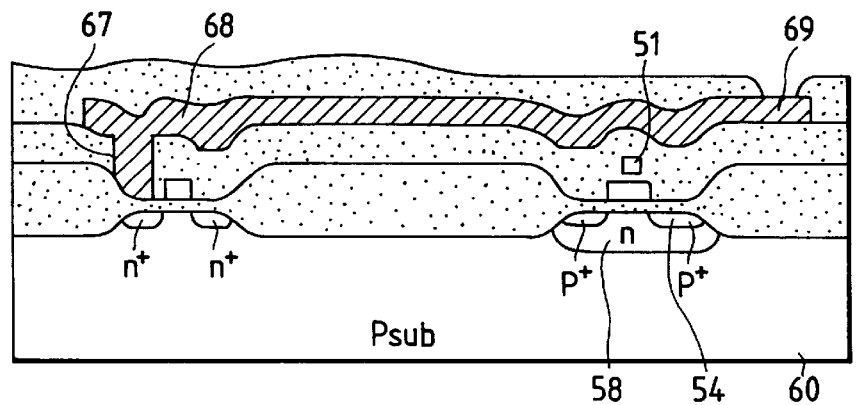

Subsequently, as shown in FIG. 6B, the oxide film formed on the poly-Si surface is peeled using dilute hydrogen fluoride. After the peeling, a chemical oxide film having a thickness of about 10 Å to 50 Å is formed in pure water added with ozone (O$_3$), an acid (H$_2$SO$_4$, HCl) added with hydrogen peroxide water, or alkali (NH$_4$OH), and is subjected to a heat treatment in a high-purity Ar or N$_2$ atmosphere at 500° C. to 600° C. for 30 minutes. When the thickness of the oxide film is to be slightly increased, an O$_2$ atmosphere is also mixed. With this operation, a very thin oxide film is formed although it has a thickness different from that formed by an impurity in the poly-Si surface of the first layer. On this wafer, a poly-Si film as the second layer is formed by Lp-CVD again. An impurity is then doped in the same manner as in the previous process, and the resultant structure is patterned to form the word lines 51. When the word line length is large, W-polyside or the like is preferably used to achieve a low resistance. Finally, as shown in FIGS. 6C and 6D, an insulating interlayer 70 such as BPSG, a contact 67, a metal wiring line 68, a passivation film are formed as in a conventional LSI process, and the resultant structure is patterned to form a pad portion 69, thus completing the manufacturing process of this embodiment. The number of masks used for forming the structure of this embodiment is half or less that required for manufacturing conventional memories such as DRAMs, SRAMs, flash E$^2$PROMs, and the like. Therefore, not only the area per bit is decreased, but also the processes are very simple, resulting in high yield and low cost. In the description of the manufacturing method of this structure, a single well structure has been exemplified. However, the present invention is not limited to this. The method of the present invention is also effective for a double well structure including n- and p-type wells, a structure formed with a channel stop layer in an isolation portion, and a structure adopting trench isolation in some cases.

In this structure, as the insulating layer between the first and second poly-Si layers, the chemical oxide film is annealed at a low temperature (500° C. to 600° C.) to form a film which has a withstand voltage about half or less that of a thermal oxide film of bulk Si, and suffers a small variation. In this case, when an oxygen ion-implantation film is formed on the surface of the first poly-Si layer, an oxide film having a defective layer containing oxygen is obtained, and the withstand voltage is lowered with high controllability. In this case, in place of a chemical oxide film, a thermal oxide film having a thickness of about 100 Å may be formed to assure a desired withstand voltage, and the capacitance can be lowered as the film thickness can be increased.

As described above, a memory according to the first embodiment of the present invention has the following merits:

1) The memory structure is simple, and the area of one cell portion is determined by only the word line and the patterning precision of an Si active layer. Therefore, since the area per cell can be equal to or smaller than that of a conventional memory without forming a contact, the bit cost can be lowered.

2) The number of masks required for forming this structure is about half that for DRAMs, SRAMs, flash RAMs, and the like, thus achieving further cost reduction. Also, since processes are simple, problems of dust, pattern errors, and the like hardly occur, thus improving the yield.

3) The write operation is achieved by breakdown of the insulating layer between the first and second poly-Si layers. Since the withstand voltage of the poly-Si oxide film is low due to the presence of the C-Si oxide film, and the withstand voltage can be stably set to be a desired value with high controllability upon combination with a new process technique such as a chemical oxidation method, an oxygen doping method, and the like, write errors hardly occur.

4) Written information is partially permanent. Therefore, neither a power supply to be connected to a memory nor a complicated operation such as a refresh operation are required.

5) The write time is very short, several 10 ns or less, and matching with the system is very good.

6) Since the read and write states do not so strongly depend on the environmental conditions (flash memories, DRAMs, and the like strongly depend on a leakage current), application variations can be extensively explored.

Second Embodiment

Figure 7A:
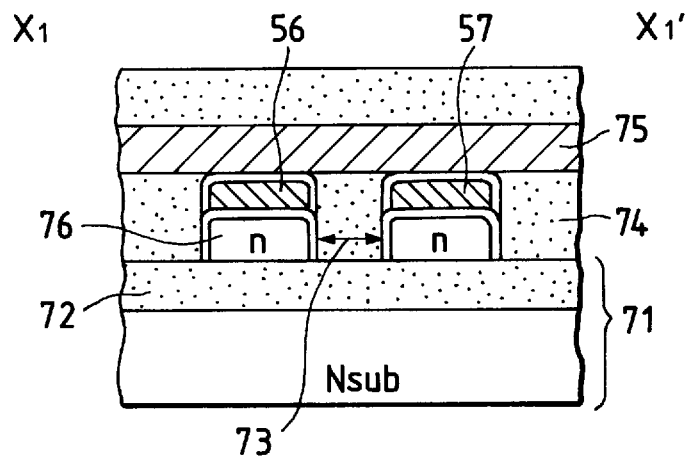
FIGS. 7A and 7B are sectional views showing a cell portion according to the second embodiment of the present invention.
Figure 7B:
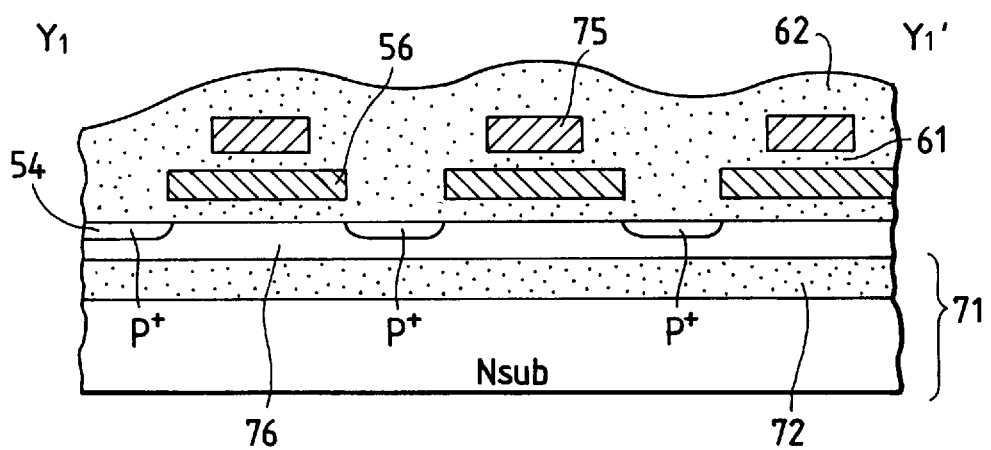
Figure 8A:
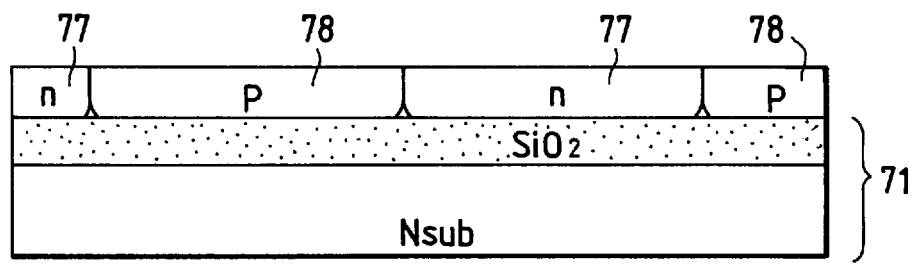
FIGS. 8A to 8C are sectional views showing the processes in the manufacturing method according to the second embodiment of the present invention.
Figure 8B:
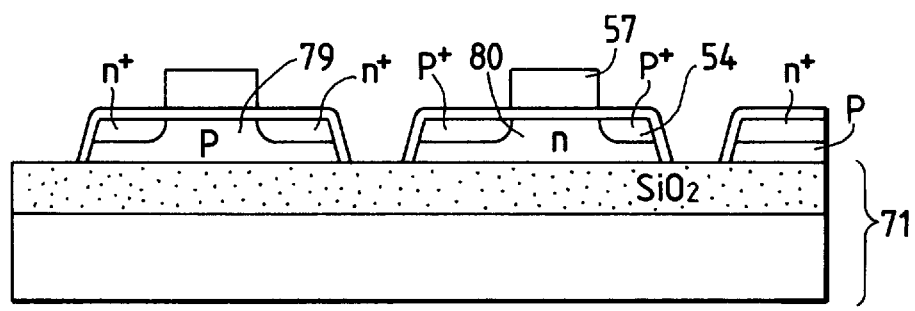
Figure 8C:
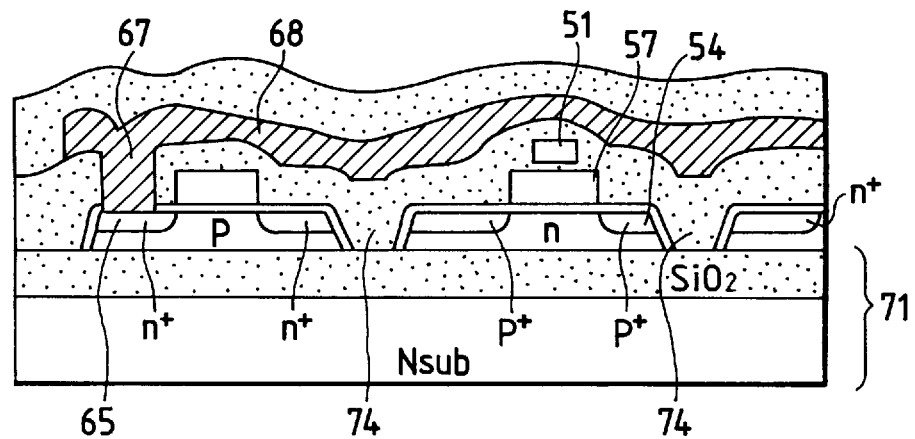

The second embodiment of the present invention will be described below with reference to FIGS. 7A to 8C. An Si wafer was used as the substrate of the first embodiment, while in the second embodiment, an SOI substrate was used. FIGS. 7A and 7B show the sectional structures (corresponding to FIGS. 5A and 5B) of a memory cell portion, and FIGS. 8A to 8C show the manufacturing method. Note that the same reference numerals in FIGS. 7A to 8C denote the same parts as in FIGS. 4 to 6D showing the first embodiment, and a detailed description thereof will be omitted. An SOI substrate 71 can use a high-quality SOI wafer such as SIMOX, a laminated SOI wafer, an SOI wafer which is manufactured by laminating, on a wafer having an insulating layer surface, a wafer which is formed by forming a porous layer on an Si surface, and forming an epitaxial film on the porous surface, and the like. The conductivity type of the substrate may be either n or p conductivity type, as long as the bias of the substrate is controlled so as not to turn on a parasitic MOS transistor formed via an SOI oxide film 72 (a MOS transistor formed when the oxide film 72 is considered as a gate insulating layer). Transistors in the cell portion are isolated in an island pattern, as indicated by 76 in FIG. 7A.

With this structure, an isolation width 73 in a direction parallel to the word lines can be smaller than that obtained using conventional selective oxidation or modified selective oxidation, and the area per bit can be further reduced. For this reason, the chip size can be reduced, thus attaining low cost and high yield.

Adjacent wells are completely isolated by an insulating layer, and the operation can be stabilized.

As can be seen from FIGS. 7A and 7B, since a channel portion 76 and a floating gate portion 56 of a TFT in the cell portion are vertically stacked, a step between adjacent cells undesirably becomes large. For this reason, an insulating layer 74 for planarization is formed between adjacent cells, so that word lines 75 can be formed flat.

In the structure of the second embodiment, since the insulating layer is formed below the well, the capacitance of the well can be smaller than that obtained when a bulk substrate is used. As a result, in the write mode, the voltage between the control gate and the floating gate can be reduced for a non-write bit, write errors hardly occur, and the margin of the structure process can be widened.

The manufacturing method according to the second embodiment of the present invention will be described below with reference to FIGS. 8A to 8C. After n-type wells 77 and p-type wells 78 are formed in corresponding regions on the SOI substrate 71, regions 79 and 80 where n- and p-type MOSFETs are to be manufactured are patterned. Then, the first poly-Si layer, and the sources and drains of the n- and p-type MOSFETs are formed following the same processes as in the first embodiment. After this, a TEOS insulating layer is formed, and is etched back to expose the upper portions of highest floating gates 57. After this, the oxide film on the surface of the first poly-Si layer is temporarily removed using dilute hydrogen fluoride, and a thin insulating layer is formed on the surface by chemical oxidation or low-temperature thermal oxidation, thus form-ing word lines 51. Thus, a planarized structure is obtained, and even when the pattern size of an upper metal wiring line 68 is reduced, high yield is attained.

Third Embodiment

The third embodiment of the present invention will be described below with reference to FIGS. 9A to 9C.

Figure 9A:
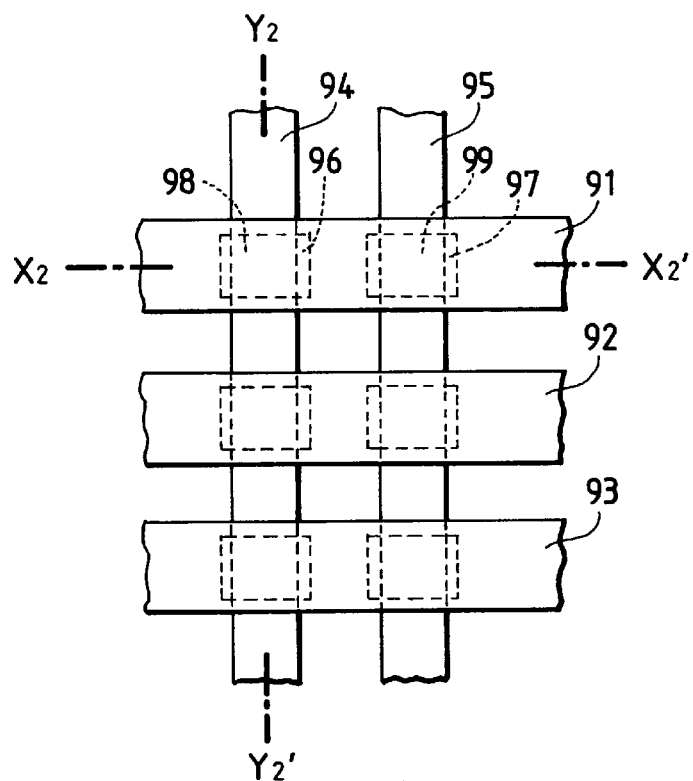
FIGS. 9A to 9C are respectively a plan view and sectional views showing a cell portion according to the third embodiment of the present invention.
Figure 9B:
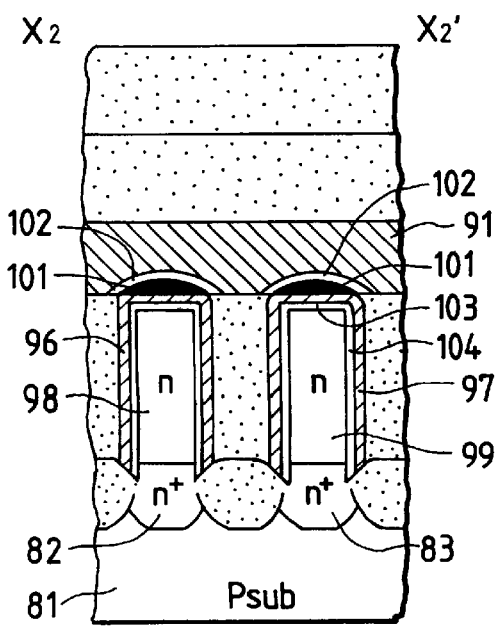
Figure 9C:
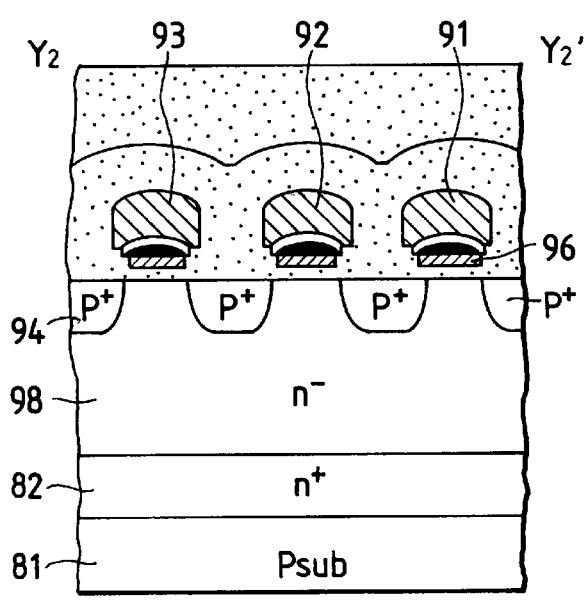

FIG. 9A is a plan view of a memory cell, FIG. 9B shows an $X_2X_2'$ section of this plan view, and FIG. 9C shows a $Y_2Y_2'$ section of this plan view. The memory cell portion shown in FIGS. 9A to 9C comprises word lines 91, 92, and 93, p$^+$-type diffusion layers 94 and 95 which serve as the sources and drains of p-type MOSFETs which are NAND-connected, floating gates 96 and 97 of the MOSFETs, n-type well layers 98 and 99 of the MOSFETs, a p-type substrate 81, n$^+$-type buried layers 82 and 83, a metal layer 101 (e.g., a Ta-based metal layer (Ta, TaN)) formed on the surface of each floating gate, and an insulating layer 102 including the metal. As can be seen from FIGS. 9B and 9C, the floating gate 96 and 97 have opposing portions sandwiching the well layers 98 and 99 therebetween, respectively.

The outstanding feature of this structure as compared with the first and second embodiments is that the floating gates 96 and 97 are formed to have a small two-dimensional size so as to further reduce the cell area per bit in practice, and this structure is suitable for high integration. The reason why this structure is realized is that the transistors in the cell portion have three-dimensional structures, as shown in FIG. 9B, and the floating gate capacitance can be increased by utilizing not only upper portions 103 of the transistors but also side wall portions 104.

The second feature of the third embodiment will be described below.

This structure performs an SOI operation unlike a conventional bulk FET since the channel portions 98 and 99 are controlled by the parallel floating gates 96 and 97. Thus, since the effective carrier mobility is high, a high-speed read operation can be attained. In addition, a short channel effect which occurs upon miniaturization of the transistors can be suppressed, and a compact structure can be easily realized. This is because the channels are controlled by the two side gates, a high electric field is hardly applied, and the potential can be controlled. Therefore, the floating gate capacitance can be increased while simply reducing the two-dimensional size of the floating gate, thus realizing miniaturization. In addition, this transistor structure is most suitable for miniaturization.

As a problem of an SOI transistor, immediately after the transistor is switched from ON to OFF, the OFF operation is delayed by minority carriers remaining in the channel portion. However, in this structure, since the n$^+$-type layer is formed immediately below the channel, and can prevent the minority carriers from remaining, a higher-speed memory operation can be realized.

The third feature of the structure according to the third embodiment of the present invention is that the word lines 91 to 93 are patterned to have sizes larger than the floating gates 96 and 97. With this structure, upon patterning of the word lines, the surface of each floating gate can be prevented from being exposed to an etching plasma or the like, and the reliability of the insulating withstand voltage between the floating gates and the word lines can be further improved.

The fourth feature of the structure according to the third embodiment of the present invention is that the floating gates 96 and 97 are polyside films consisting of TaSi$_x$ to have a low resistance although each floating gate has a very small film thickness, and the high-quality insulating layer containing the metal is formed in self-alignment on the surface layer of each floating gate. In the memory structure of the present invention, the word line and the floating gate must be changed to a low-resistance state at a desired withstand voltage (e.g., 5 V), and a high-resistance state must be reliably maintained at 3 V. When the structure is adjusted to obtain a desired withstand voltage using a thin insulating layer, a leakage current begins to flow undesirably.

Therefore, it is important to form a dense film having a wide bandgap and high insulating characteristics in at least a portion of the structure. In this case, a metal layer of Ta, TaN, Ni, Zr, or the like or a polyside layer is formed on the surface of the first poly-Si layer serving as the floating gate, and an insulating layer including the metal layer is formed before formation of the second poly-Si layer. With this structure, an insulating layer which can assure a desired withstand voltage and can reduce the leakage current by 50% or more as compared to a conventional structure can be formed.

As a result, the error rate of the memory can be further lowered, and a memory with high reliability and high stability can be realized.

The method of manufacturing the memory according to the third embodiment of the present invention will be described below with reference to FIGS. 10 to 16. FIGS. 9A to 9C have exemplified a case wherein the memory structure is formed on a bulk Si substrate. However, since an equivalent structure can be formed even on an SOI substrate, and element isolation is facilitated, as has been described in the second embodiment, a description of the manufacturing method in FIGS. 10 to 16 will be made using an SOI substrate. For the sake of descriptive simplicity, all cells are assumed to be p-type TFTs.

Figure 10:
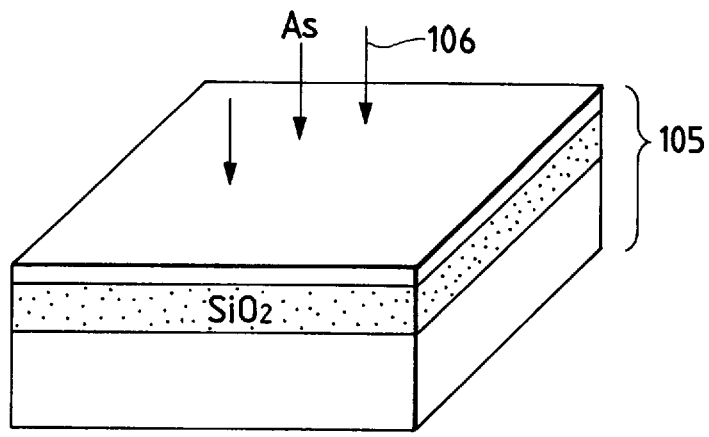
FIG. 10 is a perspective view showing a process in the manufacturing method according to the third embodiment of the present invention.

As shown in FIG. 10, an $n^+$-type layer serving as an n-type buried layer is formed on a region, where a p-type MOSFET is to be manufactured, on the surface of an SOI wafer 105. In this formation, an ion implantation method, as indicated by 106 in FIG. 10, a method in which an impurity is doped upon formation of a laminated wafer, or the like may be used. The film thickness of an Si layer which forms the $n^+$-type layer is preferably as small as possible, e.g., several thousand Å.

Figure 11:
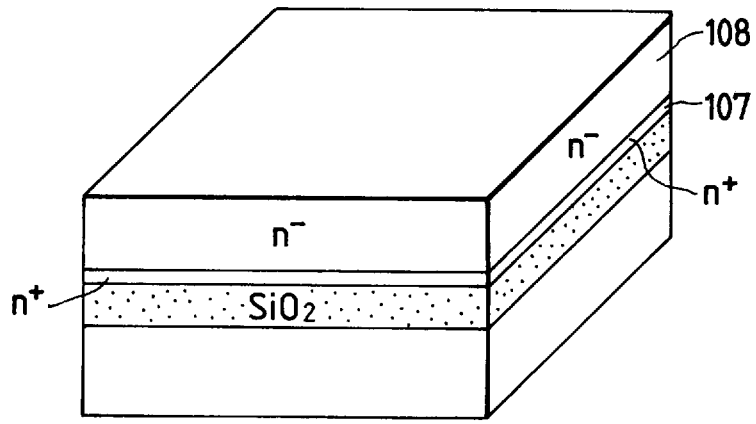
FIG. 11 is a perspective view showing a process in the manufacturing method according to the third embodiment of the present invention.

As shown in FIG. 11, a 1-μm thick epitaxial film 108 is grown on an $n^+$-type layer 107. Film growth is preferably performed at low temperature and at high speed to prevent an impurity from being redistributed or auto-doped from the $n^+$-type layer. The epitaxial process may not often be required depending on the concentration of the epitaxial layer 108 since it increases cost.

Figure 12:
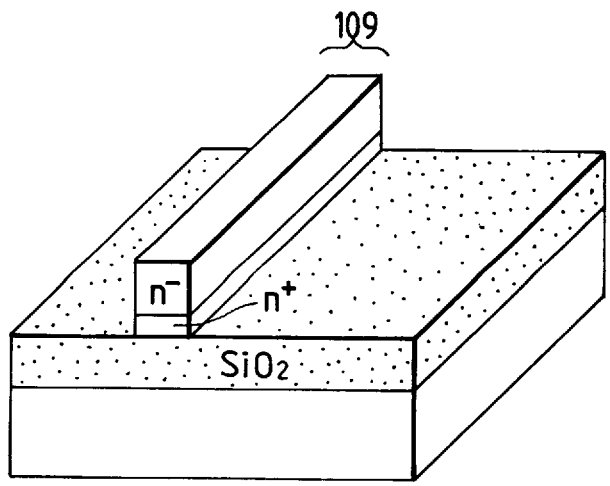
FIG. 12 is a perspective view showing a process in the manufacturing method according to the third embodiment of the present invention.

As shown in FIG. 12, the layers 107 and 108 are patterned by anisotropic etching except for a portion 109 serving as an active layer. As the resist patterning, patterning on the order of 0.35 μm can be realized using a phase shift mask, modified illumination, or the like in an i-line stepper. Also, a stepper using an ArF excimer laser, EB lithography, and the like are suitable for micropatterning.

Figure 13:
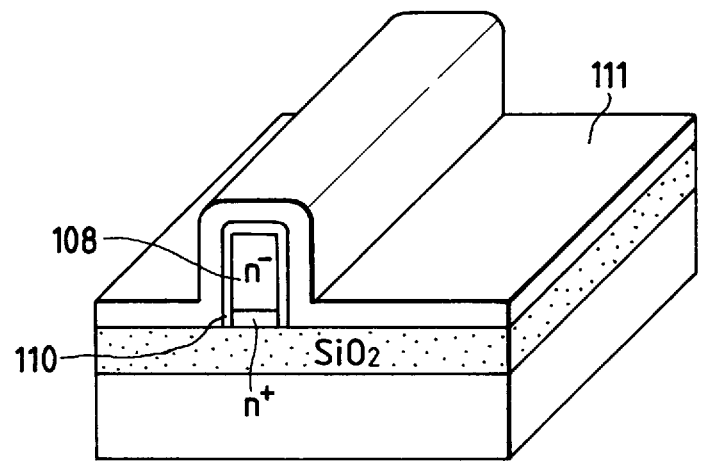
FIG. 13 is a perspective view showing a process in the manufacturing method according to the third embodiment of the present invention.

Subsequently, as shown in FIG. 13, an oxynitride film 110 is formed on the surface of the portion 109.

After the Si surface is oxidized in an $O_2$ atmosphere at 1,100° C. for 50 seconds, it is then subjected to a treatment in an $NH_3$ atmosphere at 900° C. for 60 seconds and in an $N_2O$ atmosphere at 1,100° C. for 30 seconds. After the insulating layer is formed, a poly-Si film serving as a floating gate and a metal layer are subsequently formed, as indicated by 111 in FIG. 13. More specifically, a 2,000-Å thick poly-Si film is formed at 620° C., and a 1,500-Å Ta film is grown thereon by sputtering. Then, phosphorus is ion-implanted in the surface of the Ta metal film, thus forming a Ta polyside layer containing metal Ta in its surface layer.

Figure 14:
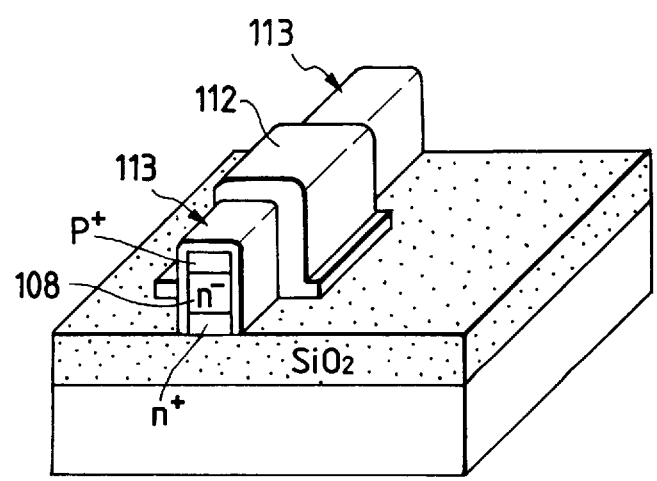
FIG. 14 is a perspective view showing a process in the manufacturing method according to the third embodiment of the present invention.

In the next step, as indicated by 112 in FIG. 14, a floating gate is patterned. Using the resist mask for the floating gate, boron is ion-implanted, as indicated by 113 in FIG. 14, thereby forming the source and drain.

Figure 15:
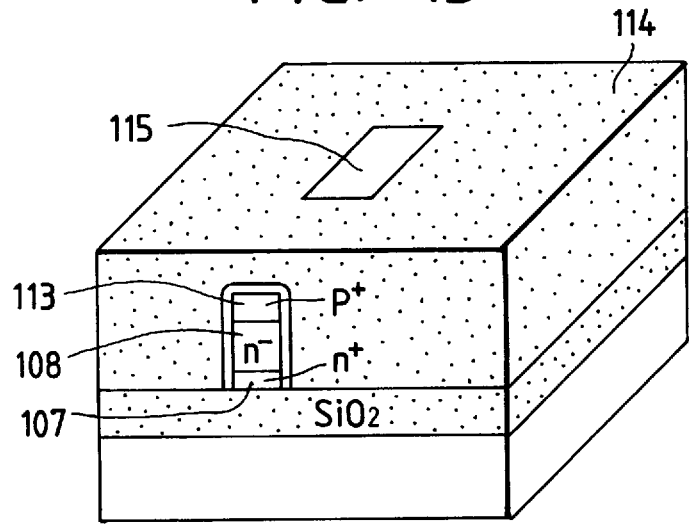
FIG. 15 is a perspective view showing a process in the manufacturing method according to the third embodiment of the present invention.

Thereafter, as shown in FIG. 15, a TEOS layer 114 is formed, and after a resist is coated thereon, the layer is etched back to expose a surface 115 of the floating gate 112. After the exposed portion is washed to temporarily remove the insulating film on the surface layer containing Ta, the resultant structure is subjected to a heat treatment in an $O_2$ atmosphere at 200° C. to 400° C., thereby forming an insulating oxide film containing a Ta metal. In the formation of the insulating oxide film, a method which also uses plasma irradiation may be used. The treatment is performed at a pressure of 30 mtorr and at a temperature of 450° C. while supplying Ar and $O_2$ gases at 300 and 8 sccm.

Figure 16:
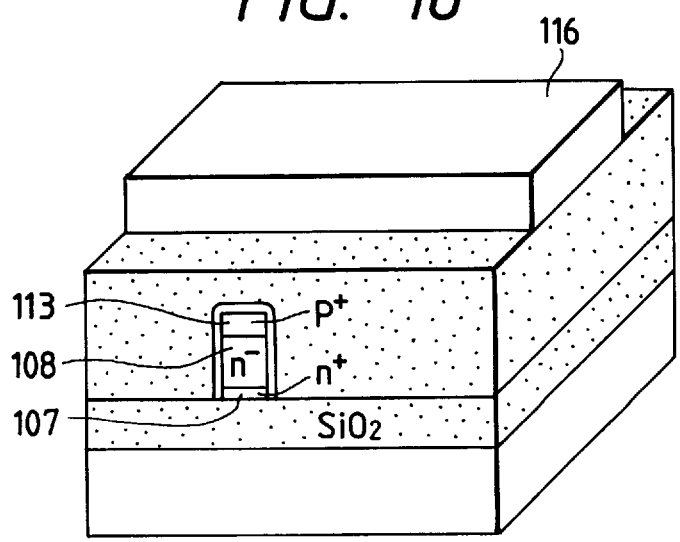
FIG. 16 is a perspective view showing a process in the manufacturing method according to the third embodiment of the present invention.

As shown in FIG. 16, the second poly-Si layer of a word line 116 is patterned to cover the insulating oxide film on the floating gate surface. Thereafter, an insulating interlayer such as BPSG is formed, and a contact hole, a wiring metal, and a passivation insulating layer are formed. Finally, a pad is etched to complete the sample chip.

In the above description, a structure in which a metal layer is stacked on the floating gate surface has been exemplified. Alternatively, an oxide film on a single poly-Si layer may be used as in the first and second embodiments.

When a layer having the same conductivity type as that of the well layer and a higher concentration than the well layer is formed on an upper edge portion of the well layer, changes in threshold value at the edge portion, and withstand voltage errors at the edge portion can be effectively prevented.

Fourth Embodiment

Figure 17:
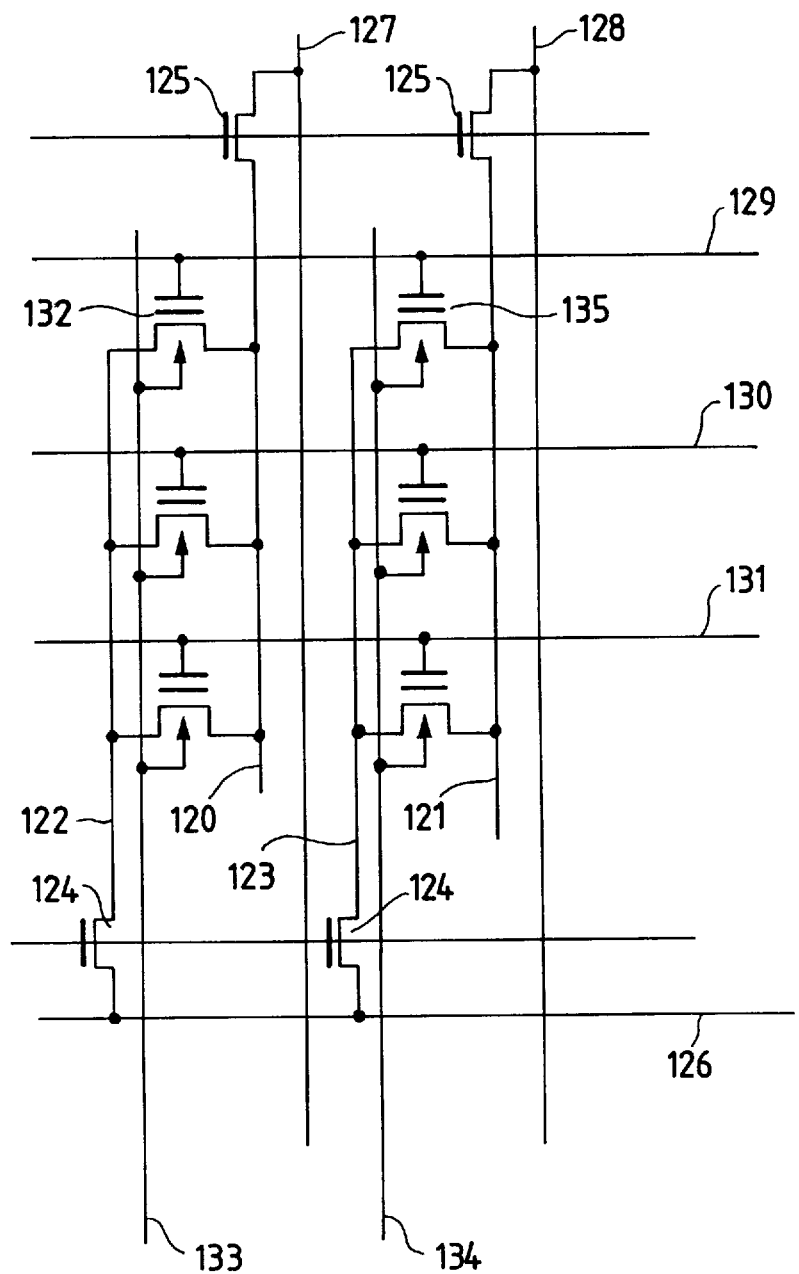
FIG. 17 is a circuit diagram showing an equivalent circuit of a cell portion according to the fourth embodiment of the present invention.

The fourth embodiment of the present invention will be described below with reference to FIG. 17 and FIGS. 18 to 21. In the fourth embodiment, cells are arranged in a NOR matrix to improve characteristics associated with functions such as a random access function. FIG. 17 shows an equivalent circuit of a cell portion of the fourth embodiment. The circuit comprises buried bit lines 120 and 121, and buried source lines 122 and 123, which consist of diffusion layers. Contacts in units of cells are not formed to reduce each cell area. The bit and source lines are connected to a common source line 126 and main bit lines 127 and 128 via selection transistors 124 and 125 at a desired period according to an application, such as 8 bits, 32 bits, 64 bits, or the like. The circuit also comprises word lines 129, 130, and 131. A transistor 132 of the cell portion comprises an n-type MOSFET, and the diffusion layers of the source and drain have $n^+$ conductivity type. P-type well layers 133 and 134 are arranged in units of columns, and each two adjacent columns are isolated from each other.

The driving method for this device will be explained below. First, the write operation will be described. When a write bit is assumed to be the transistor 132 of the cell portion in FIG. 17, the buried source line 122, buried bit line 120, and p-type well 133 of this transistor are fixed at 0 V, and at least the well potentials (134 in FIG. 17) of other columns are set in a floating state. When a pulse of 10 V is applied to the word line 129, a voltage of about 6 V is applied across the floating gate of the transistor 132 and the word line 129, and the floating gate and the word line 129 change to a low-resistance state. On the other hand, only a bias of 1 V or less is applied across the floating gate of a transistor 135 and the word line 129 since the well 134 is set in the floating state, thus maintaining a high-resistance state. The respective word lines are simultaneously driven to achieve parallel write operations.

The read operation will be described below. The threshold value of the n-type MOSFET is set at about 1.5 V. In the read operation, the well potentials of all the cells are fixed to be a lowest potential value, a voltage applied to a read word line is set at 2.0 V, and a voltage applied to non-read word lines is set at 0 V. Before reading, the respective bit lines are pre-charged to $V_{DD}$=2 V to turn off the bit line switches (transistors) 125, and a word line to be selected is set at 2 V. The effective gate bias of a written cell becomes 2 V, the channel is turned on, and the bit line is set at the source potential, e.g., 0 V. On the other hand, the effective gate bias of each non-written cell becomes 1.2 V equal to or lower than the threshold value, since it is subjected to capacitance division with the floating gate. As a result, the transistor of the cell is set in an OFF state, and the bit line is kept at $V_{DD}$. A sense amplifier reads out changes in potential of these bit lines as in the first embodiment.

Figure 18:
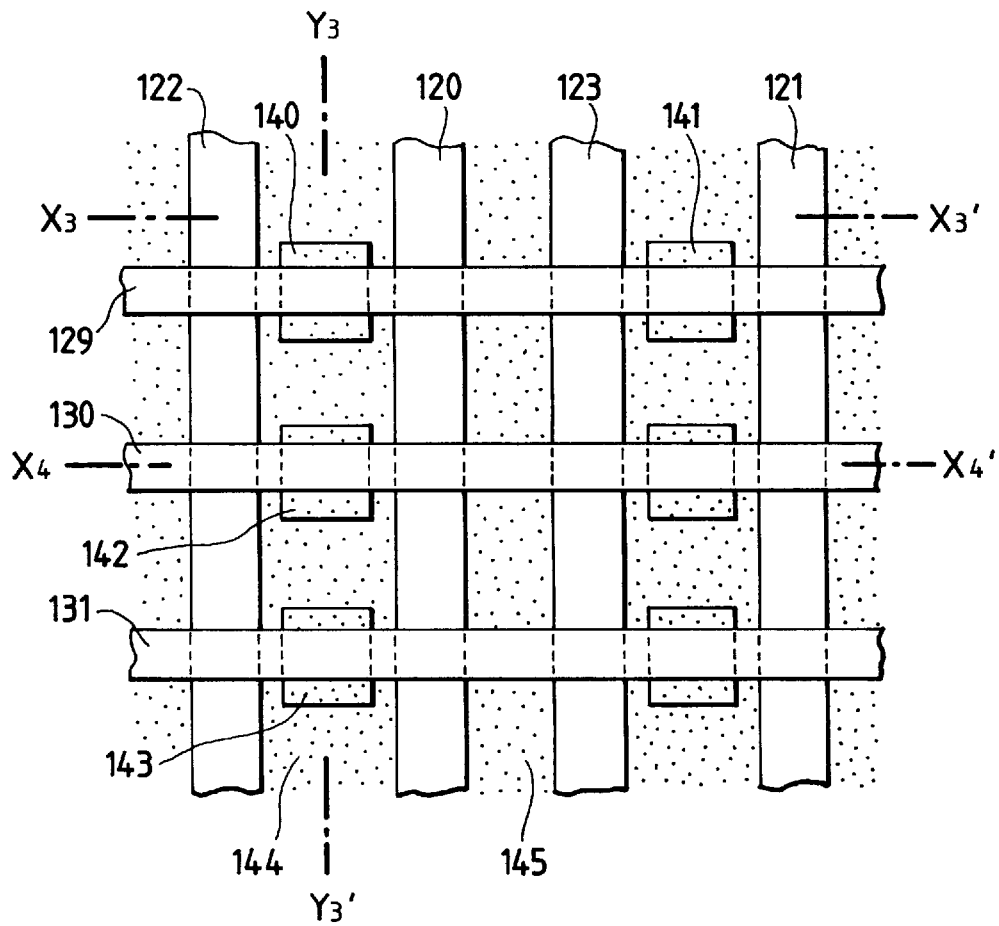
FIG. 18 is a plan view showing the cell portion according to the fourth embodiment of the present invention.
Figure 19:
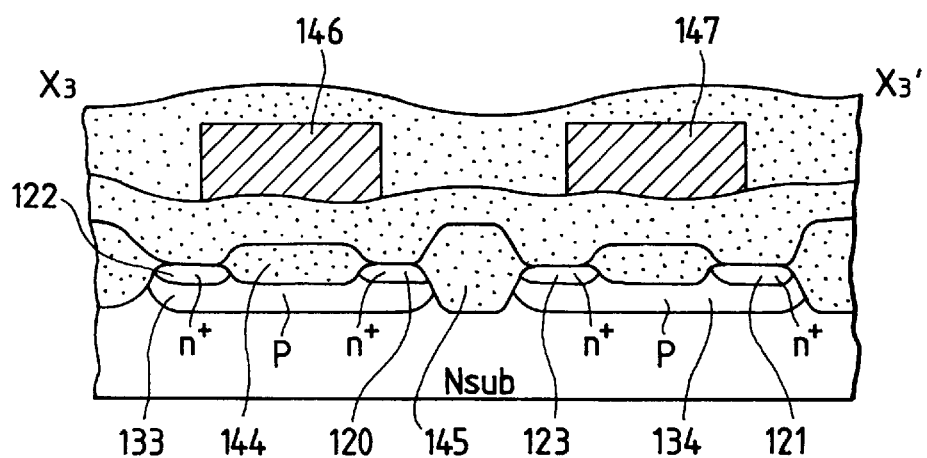
FIG. 19 is a sectional view showing the cell portion according to the fourth embodiment of the present invention.
Figure 20:
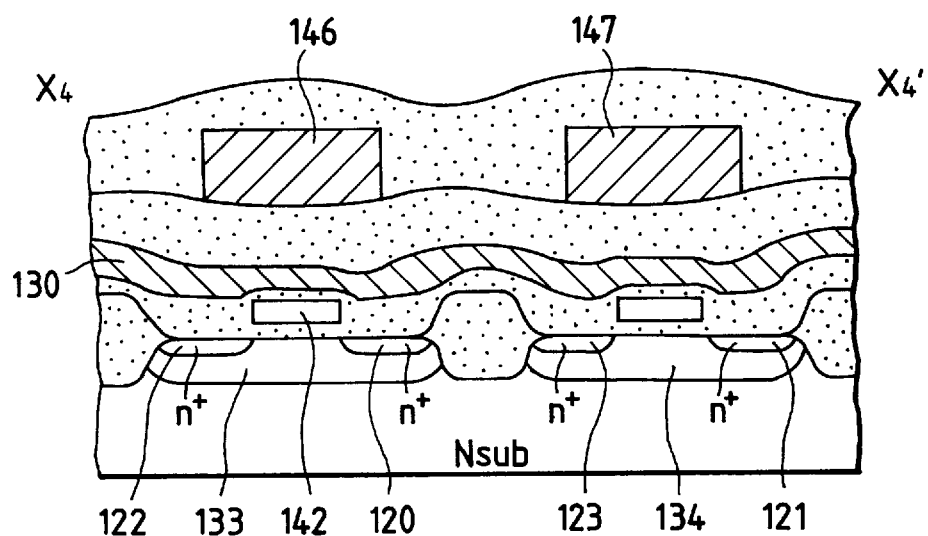
FIG. 20 is a sectional view showing the cell portion according to the fourth embodiment of the present invention.
Figure 21:
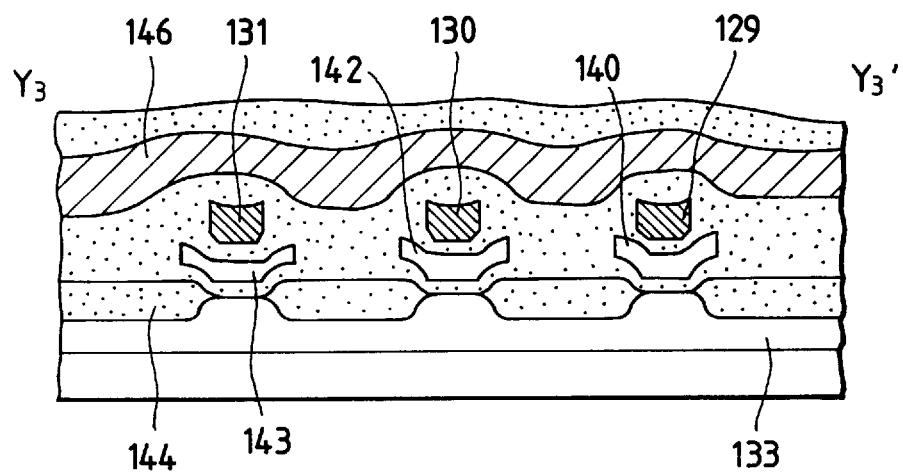
FIG. 21 is a sectional view showing the cell portion according to the fourth embodiment of the present invention.

The two-dimensional structure and sectional structure of the fourth embodiment will be explained below with reference to FIGS. 18 to 21. FIG. 18 is a plan view of a memory cell portion, FIG. 19 is a sectional view taken along a line $X_3X_3'$ of FIG. 18, FIG. 20 is a sectional view taken along a line $X_4X_4'$ of FIG. 18, and FIG. 21 is a sectional view taken along a line $Y_3Y_3'$ of FIG. 18.

The same reference numerals in FIGS. 18 to 21 denote the same regions as in FIG. 17, and a detailed description thereof will be omitted. This embodiment exemplifies a structure on a bulk Si substrate. However, as in the above-mentioned embodiments, the structure of this embodiment can also be manufactured on an SOI substrate. Wells in each two adjacent columns are isolated from each other by a selective oxide film 145, and floating gates in each two adjacent rows are isolated from each other by a thin selective oxide film 144. The buried bit lines are connected to metal wiring layers 146 and 147 for global bit lines at every 8 to 64 bits. Cells have floating gates 140 to 143.

When the NOR matrix of the fourth embodiment is adopted, various read and write methods are realized, and the memory of this embodiment can be applied to various systems.

Fifth Embodiment

The fifth embodiment of the present invention will be described below with reference to FIG. 22. The same reference numerals in FIG. 22 denote the same parts as in the above embodiments, and a detailed description thereof will be omitted. The circuit shown in FIG. 22 comprises a memory unit 150 described in the first embodiment, an SRAM unit 151, a scanning circuit 152 for sequentially reading out data from the SRAM, an EXOR circuit 153 for verifying the readout result of the memory of the present invention by comparing it with data from the SRAM, and a control circuit 154 for controlling the driving operation of the memory unit 150 in accordance with an output from the EXOR circuit. The SRAM unit 151 includes CMOS SRAM memory cell portions 155 which preferably comprise p-type MOS load memory cells since they require low consumption power. The SRAM unit 151 also includes MOS switches TR1, TR2, TR3, and TR4 for controlling the driving operations of the SRAM memory cells, common data lines 156, sense amplifiers 157, output buffers 158, and switches 159 for selecting the outputs from the output buffers. The EXOR circuit 153 comprises gates 160, 161, 166, 167, and 168, which are input to CMOS inverters via floating gates 162, p-type MOS transistors 163, and n-type MOS transistors 164. An output 165 from the first CMOS inverter is input to a gate 166 of the second CMOS inverter. An output 169 from the second CMOS inverter is input to the control circuit 154. Word lines 170, 171, and 172 are commonly arranged in the memory cell unit of the present invention, and the SRAM memory unit.

The operation method of the fifth embodiment of the present invention will be described below. Data are written in a desired column of the memory unit 150, and the same data are written in the SRAM cells in the SRAM memory unit 151. The memory unit 150 is set in a read mode, and the data in the column are sequentially read out using a sense amplifier 15. In synchronism with this read operation, the scanning circuit 152 reads out the corresponding bits from the SRAM cells of the SRAM memory unit 151 via the sense amplifiers 157, and these readout outputs are input to the gates 160 and 161 of the EXOR circuit 153. Since the output from the EXOR circuit 153 changes to high level when the values input to the gates 160 and 161 are different from each other, and changes to low level when they are equal to each other, whether or not data are normally written in and read out from the memory unit 150 can be checked based on the output from the EXOR circuit 153.

The EXOR circuit 153 is a CMOS circuit having multiple input gates via the floating gates, and can be manufactured based on a structure equivalent to that of the memory unit 150. In addition, the EXOR circuit 153 can realize high-performance processing using a smaller number of transistors. In this embodiment, an EXOR logic operation is executed. Alternatively, when input gates for 8-bit inputs are arranged via the floating gates to constitute the same CMOS inverters as above, a majority logic of input data can be realized by two transistors (n-type and p-type MOS transistors). By utilizing this majority logic, parity check operations of input and readout 8-bit data can also be attained.

Figure 22:
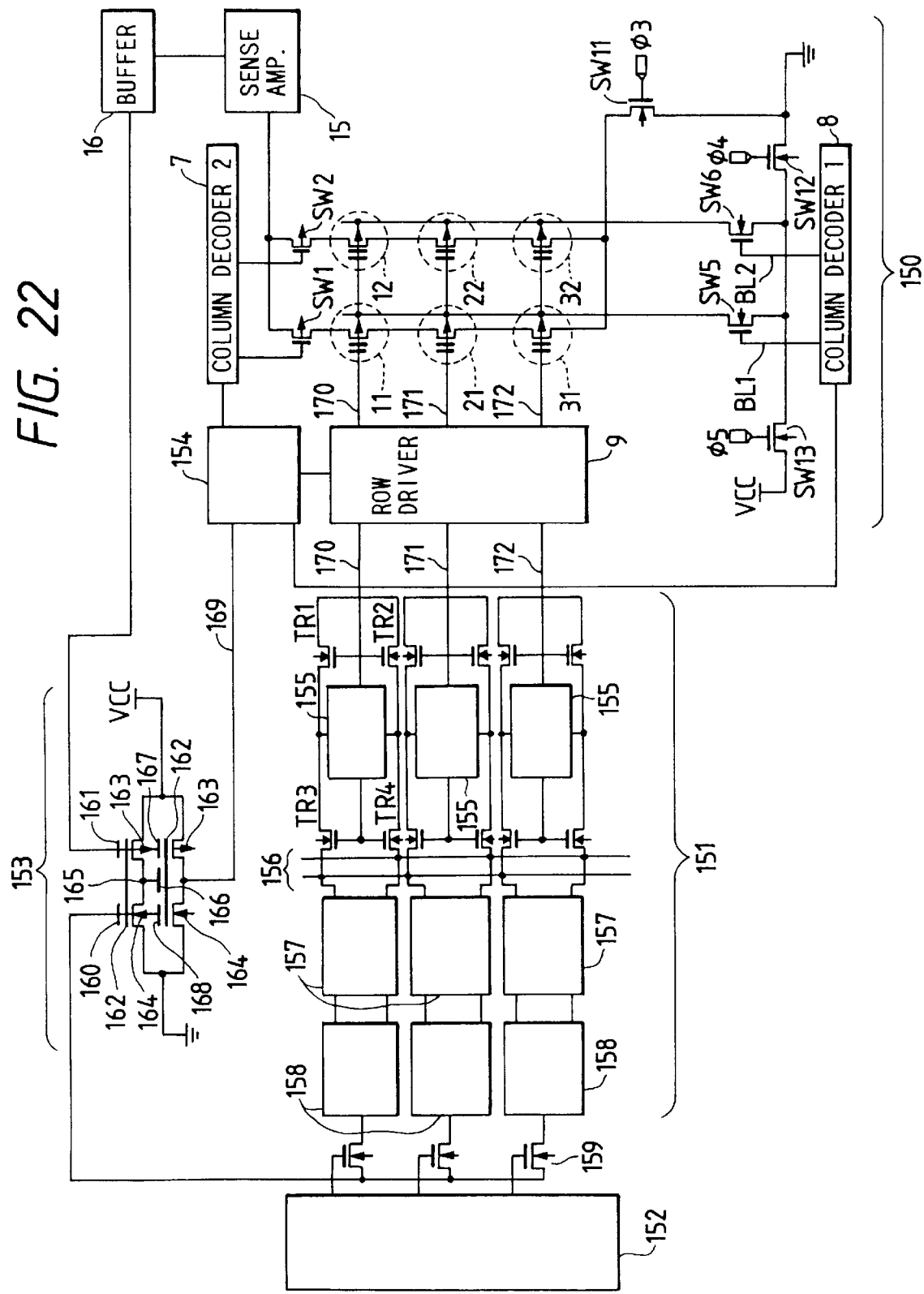
FIG. 22 is a circuit diagram showing an equivalent circuit according to the fifth embodiment of the present invention.

The description of the operation of the circuit shown in FIG. 22 will be continued. When an operation error is confirmed based on the output result 169, the SRAM data are written again in the next column of the memory unit 150. With this control, an operation for correcting write and read errors can be realized.

At least one bit of a data string may be assigned as an error check bit of the data string, and is confirmed when the data string is read out.

In the arrangement shown in FIG. 22, the SRAM memory unit has a memory size equal to that of one column of the memory unit 150. However, the present invention is not limited to this size. For example, the memory size may be increased to a level as a buffer memory to achieve high-speed random access and write operations. In the above description, the buffer memory comprises an SRAM. Alternatively, a DRAM, a flash memory, or the like may be arranged on a single chip to perform the above-mentioned operation.

The above-mentioned arrangement of the fifth embodiment has the following merits.
1) The error rate is very low.
2) Whether or not data is normally written can be confirmed on the chip.

3) The logic circuit for performing confirmation can be manufactured to have the same structure as that of the memory of the present invention without adding any new processes.
4) The logic circuit can be constituted by a smaller number of transistors than conventional logic circuits. For this reason, since a peripheral circuit can be realized in a small area, low cost and high performance can be attained.
5) Since a memory (SRAM, DRAM, flash memory, or the like) having a structure different from the memory structure of the present invention is incorporated, high-speed random access and write operations can be realized.

Sixth Embodiment

In the sixth embodiment of the present invention, the storage device of the present invention is applied to an external storage card (PC card) for, e.g., a personal computer.

Figure 23:
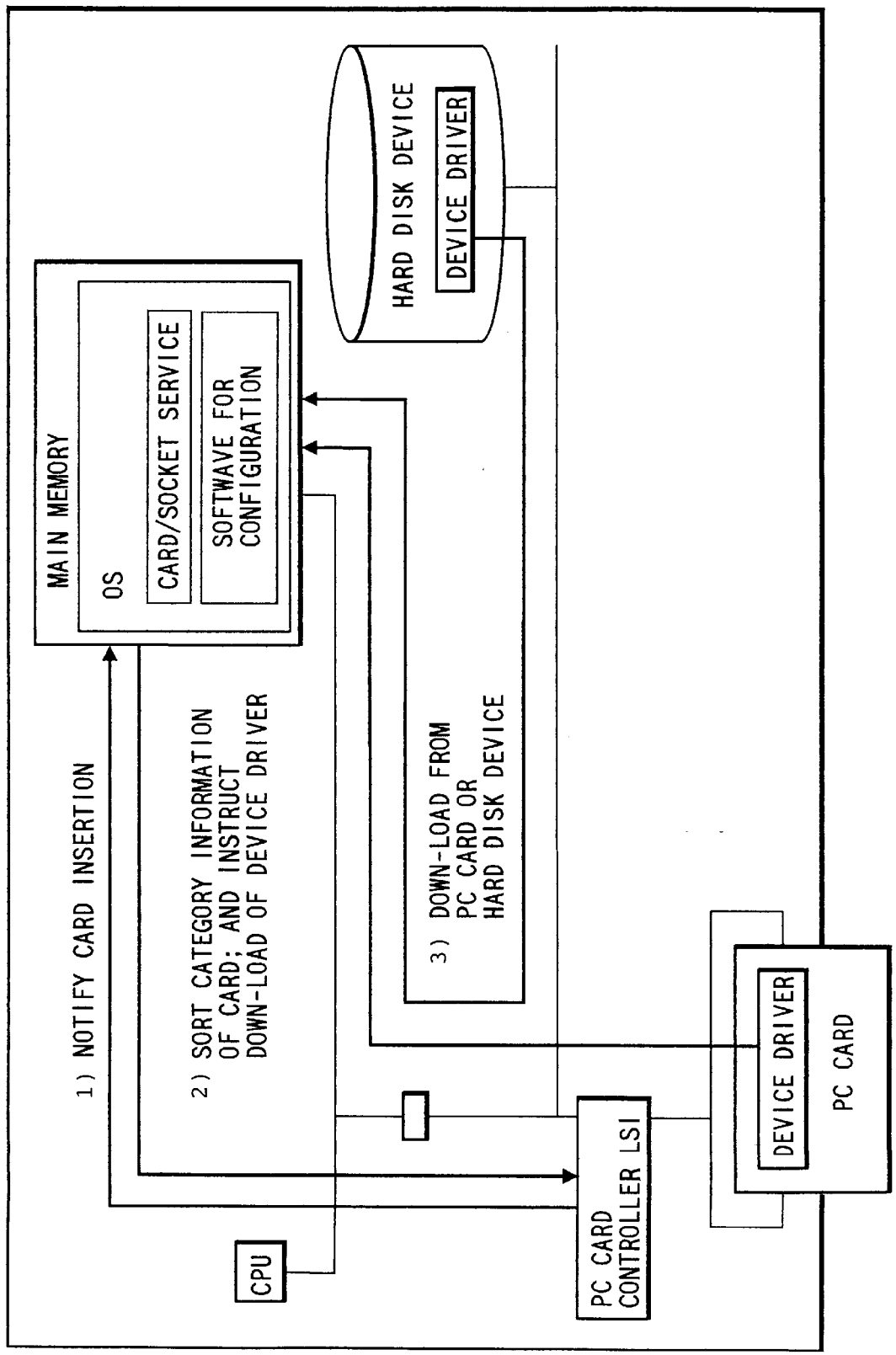
FIG. 23 is a block diagram of a system upon application to a PC card according to the sixth embodiment of the present invention.

An application of the present invention will be explained below. FIG. 23 is a diagram showing the relationship between a card and a system when the present invention is applied to a PC card.

In an existing notebook type personal computer or portable information communication equipment which can cope with a PC card, a device driver for a PC card to be used resides in a main memory. When a personal computer or portable information communication equipment uses a plurality of types of PC cards, the number of device drives to be resided in the main memory unit increases, and some application software programs cannot operate due to the large total capacity of the resident device drivers.

In a card constituted by using the memory chip of the present invention, a ROM unit is also arranged on the chip to store the device driver of the card and CIS information (card-information-structure), i.e., the type and capacity of the card, identification information and configuration information of the card, and the like. Thus, the card of this embodiment has a function of notifying card insertion, and executing down-loading in accordance with a device driver down-load instruction, as shown in FIG. 12.

An interface between the card and the main body has a 68-pin connector, and complies with a data bus width of 32 bits, a clock frequency of 16 MHz, a maximum data transfer rate of 60 Mbytes/s, and the like in accordance with the formats of PCMCIA (the standardization group in U.S.A.) and JEIDA (Japan Electronic Industry Development Association).

Seventh Embodiment

The seventh embodiment of the present invention will be described below with reference to FIG. 24. The seventh embodiment is directed to an IC card which inputs/outputs information based on light. The IC card comprises a storage device 180 of the present invention, a battery 181, a semiconductor laser 182, a photodetector 185, a control circuit 186 for controlling the storage device mounted on a board 179, the laser, and the photodetector, a transparent resin package 183, and a lens 184. The IC card of the present invention exchanges all kinds of information to be exchanged with an external circuit such as data to be written, data to be read out, control clocks, and the like on the basis of light, and all the remaining functions are executed by the control circuit 186 arranged on the board 179.

Figure 24:
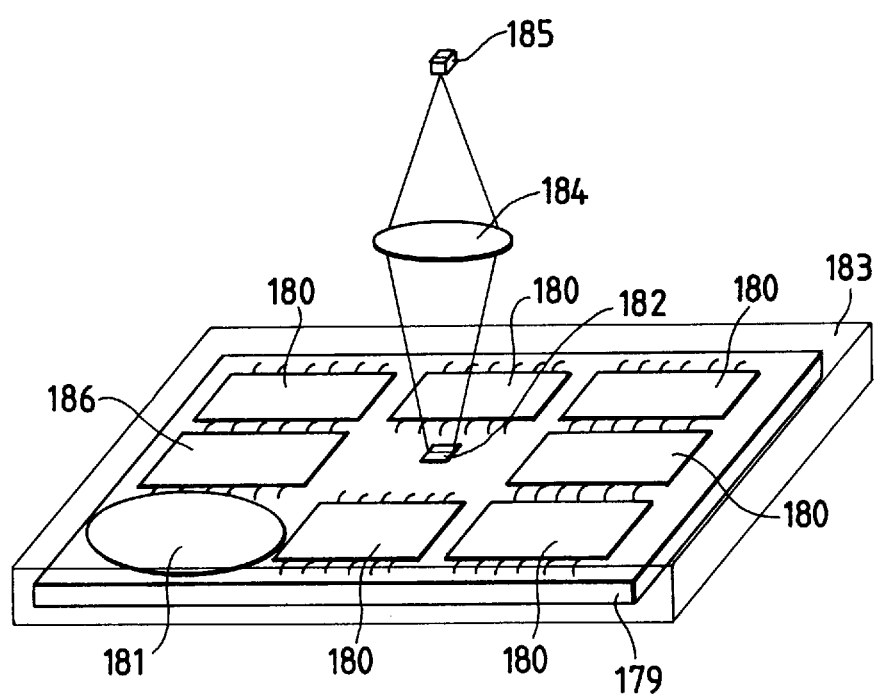
FIG. 24 is a perspective view showing a storage device according to the seventh embodiment of the present invention.

Although not shown in FIG. 24, alignment marks for aligning an optical system are formed on the board 179.

When the IC card of this embodiment is set in a reader/writer of this card, the card is set at a desired position at high speed.

The IC card of this embodiment has the following merits.
1) Unlike a conventional IC card, the card of this embodiment has high reliability since it is free from a problem of a contact error of contact pins, a problem of low reliability of pins, and the like.
2) IC card mounting can be realized with very low cost since the IC card comprises a transparent resin package obtained by simple integral molding.
3) Since the modulation frequency of the semiconductor laser is high, information can be input/output at a high bit rate, and low consumption power can be attained.

Eighth Embodiment

The eighth embodiment of the present invention is directed to a storage device incorporating a programmable logic array in which the first poly-Si layer constituting the floating gates of the storage device of the present invention, and the second poly-Si layer constituting word lines are arranged in a matrix, a large number of AND gates and OR gates are arranged, and lines at each intersection of the matrix are changed from a high-resistance state to a low-resistance state to be substantially connected to each other, thereby freely setting a logic according to the intended application purpose of each user. The resistance between the lines can be changed to a low-resistance state in correspondence with the bias to be applied to lines arranged in a matrix.

When the storage device incorporates a programmable logic array, an operation according to the specifications of each user can be realized without changing the mask, thus reducing cost and shortening the delivery period to users.

The storage device of the present invention has the following effects: a larger capacity and a smaller cell area per bit than those of the conventional semiconductor storage device, permanently stable written information, low consumption voltage, low-voltage driving, storage and holding without any battery, high reliability, an easy driving method and high operability, high-speed read/write operations, a low error rate, wide use environments, a short manufacturing process, high yield, and high performance of a chip realized by integrating other types of storage devices, logic circuits, and the like as peripheral circuits on a single chip, and the like. The storage device of the present invention can be generally used not only as storage devices for computers but also as storage media for audio/video information, and can replace commercially available audio tapes, video tapes, CD-ROMs, and the like by utilizing higher performance characteristics than them. Also, the storage device of the present invention is suitable for an external storage device for portable equipment, electronic publishing, a controller, and an electronic video/image memory, e.g., a system which stores an output from a still video camera, FAX, copy machine, or the like in a card constituted by the storage device of the present invention to allow a user to easily carry video data.

What is claimed is:

1. A storage device which comprises, on a substrate, a first semiconductor region of one conductivity type, second and third semiconductor regions of a conductivity type opposite to the one conductivity type, which are contiguous to said first semiconductor region, a first electrode which is formed on and spaced from an isolating region that is for isolating said second and third semiconductor regions, said first electrode being spaced from the isolating region by a first insulating layer, and a second electrode formed on said first electrode and spaced from said first electrode by a second insulating layer, wherein a resistance between said first and second electrodes is changed from a high-resistance state to a low-resistance state.

2. A device according to claim 1, wherein the change in resistance is attained by a voltage to be applied to said second electrode.

3. A storage device which comprises, on a substrate, a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, and a second electrode formed on said first electrode and spaced from said first electrode by a second insulating layer, wherein a resistance between said first and second electrodes is changed from a high-resistance state to a low-resistance state, and wherein a plurality of said storage devices are provided, the second semiconductor regions of said plurality of storage devices are connected to each other, and the third semiconductor regions thereof are connected to each other.

4. A device according to claim 1, wherein said substrate comprises a substrate which has an Si layer on an insulating layer.

5. A storage device which comprises, on a substrate, a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, and a second electrode formed on said first electrode and spaced from said first electrode by a second insulating layer, wherein a resistance between said first and second electrodes is changed from a high-resistance state to a low-resistance state, and wherein a plurality of said storage devices are arranged in a matrix, a line for commonly connecting the second electrodes in one direction of arrays is arranged, the first semiconductor regions of said storage devices arranged in a direction perpendicular to the line are commonly connected, and the first semiconductor regions in the respective arrays are electrically isolated from each other.

6. A storage device which comprises, on a substrate, a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, and a second electrode formed on said first electrode and spaced from said first electrode by a second insulating layer, wherein a resistance between said first and second electrodes is changed from a high-resistance state to a low-resistance state, and wherein an opposing area between said first electrode and a semiconductor region having said first, second, and third semiconductor regions is larger than an opposing area of said second electrode and said first electrode.

7. A storage device which comprises, on a substrate, a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, and a second electrode formed on said first electrode and spaced from said first electrode by a second insulating layer, wherein a resistance between said first and second electrodes is changed from a high-resistance state to a low-resistance state, and wherein said first electrode has at last two opposing portions which sandwich said first semiconductor region therebetween.

8. A device according to claim 1, wherein said first electrode consists of a material containing poly-Si.

9. A device according to claim 1, wherein an insulating layer between a semiconductor region including said first, second, and third semiconductor regions, and said first electrode comprises a film consisting of Si, N, and O.

10. A device according to claim 1, wherein a peripheral circuit of said storage device comprises a CMOS circuit.

11. A device according to claim 1, wherein said storage device is mounted on a card.

12. A storage device which comprises, on a substrate, a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, and a second electrode formed on said first electrode and spaced from said first electrode by a second insulating layer, wherein a resistance between said first and second electrodes is changed from a high-resistance state to a low-resistance state, and wherein said first and second electrodes are arranged in a matrix, and a region for changing a resistance between the first and second electrodes on each intersection of the matrix from a high-resistance state to a low-resistance state is arranged.

13. A storage device which comprises, on a substrate, a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, and a second electrode formed on said first electrode and spaced from said first electrode by a second insulating layer, wherein a resistance between said first and second electrodes is changed from a high-resistance state to a low-resistance state, and wherein a plurality of said storage devices are provided, the first semiconductor region of a storage device in which information is written is connected to a desired power supply, and the first semiconductor region of a storage device in which no information is written is set in a floating state.

14. A storage device which comprises, on a substrate, a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, and a second electrode formed on said first electrode and spaced from said first electrode by a second insulating layer, wherein a resistance between said first and second electrodes is changed from a high-resistance state to a low-resistance state, wherein said change is attained by a voltage to be applied to said second electrode, and wherein a first voltage $V_1$ to be applied to said second electrode when information is written in said storage device is higher than a second voltage $V_2$ to be applied to said second electrode when information is read out from said storage device.

15. A device according to claim 7, wherein a semiconductor region having an impurity concentration higher than an impurity concentration of said first semiconductor region is arranged in contact with said first semiconductor region.

16. A storage device which comprises, on a substrate, a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, and a second electrode formed on said first electrode and spaced from said first electrode by a second insulating layer, wherein a resistance between said first and second electrodes is changed from a high-resistance state to a low-resistance state, wherein a peripheral circuit of said storage device comprises a CMOS circuit; and wherein a circuit having a plurality of gate electrodes via floating gates is arranged in at least a portion of the peripheral circuit.

17. A storage device which comprises, on a substrate, a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, and a second electrode formed on said first electrode and spaced from said first electrode by a second insulating layer, wherein a resistance between said first and second electrodes is changed from a high-resistance state to a low-resistance state, wherein said storage device is mounted on a card, and wherein the card comprises a read-only storage device.

18. A storage device which comprises, on a substrate, a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, and a second electrode formed on said first electrode and spaced from said first electrode by a second insulating layer, wherein a resistance between said first and second electrodes is changed from a high-resistance state to a low-resistance state, wherein said storage device is mounted on a card, and wherein the card comprises a light-emitting element and a light-receiving element.

19. A device according to claim 13, wherein the following relations are satisfied:

$$\frac{C_{FG}}{C_{FG} + C_{CG}} V_1 \geq V_{BD}$$

$$\frac{C_{CG}}{C_{FG} + C_{CG}} V_2 < V_{th}$$

$$V_2 > V_{th}$$

where $V_{BD}$ is the voltage across said first and second electrodes when the resistance between said first and second electrodes changes from a high-resistance state to a low-resistance state, $V_{th}$ is the threshold value of an insulating gate transistor formed when said second and third semiconductor regions are assumed to be main electrode regions, said first semiconductor region is assumed to be a control electrode region, and said first electrode is assumed to be a control electrode, $C_{FG}$ is the capacitance formed between said first electrode, and said first, second, and third semiconductor regions, and $C_{CG}$ is the capacitance formed between said first and second electrodes.

20. A storage device which comprises, on a substrate, a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, and a second electrode formed on said first electrode and spaced from said first electrode by a second insulating layer, wherein a resistance between said first and second electrodes is changed from a high-resistance state to a low-resistance state, wherein said storage device further comprises a second storage device selected from a group consisting of a DRAM, an SRAM and a flash memory, wherein data to be written is written in said storage device and the second storage device, the written data are read out from the two storage devices, and the two readout results are collated to each other, and wherein a region in which the collation result is written is arranged in said storage device.

21. A semiconductor device which comprises a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, a second electrode formed on said first electrode and spaced from said first electrode by a second insulating layer, and driving means for applying a voltage to said second electrode so that a resistance between said first and second electrodes is changed from a high resistance state to a low-resistance state.

22. A device according to claim 21, wherein a plurality of said storage devices are provided, and said second semiconductor region of one of said plurality of semiconductor devices and said third semiconductor region of another of said plurality of semiconductor devices are formed by a common semiconductor region.

23. A device according to claim 21, wherein a plurality of said semiconductor devices are provided on a substrate.

24. A device according to claim 23, wherein said substrate comprises an insulating surface.

25. A device according to claim 23, wherein said semiconductor devices are arranged in a matrix, a line for commonly connecting the second electrodes in a row direction of arrays is provided, said first semiconductor regions of said semiconductor devices arranged in a column direction are commonly connected, and said first semiconductor regions in respective rows are electrically isolated from each other.

26. A device according to claim 23, wherein an opposing area between said first electrode and a semiconductor region having said first, second, and third semiconductor regions is larger than an opposing area of said second electrode and said first electrode.

27. A device according to claim 23, wherein said first electrode has at least two opposing portions which sandwich said first semiconductor region therebetween.

28. A device according to claim 23, wherein said first electrode comprises a material containing poly-Si.

29. A device according to claim 23, wherein an insulating layer provided between a semiconductor region selected from among said first, second, and third semiconductor regions, and said first electrode comprises a film consisting of Si, N, and 0.

30. A device according to claim 23, wherein said semiconductor device further comprises a DRAM, SRAM or flash memory.

31. A device according to claim 23, wherein a peripheral circuit of said semiconductor device comprises a CMOS circuit.

32. A device according to claim 23, wherein said semiconductor device is mounted on a card.

33. A device according to claim 23, wherein a plurality of said semiconductor device s are provided, and each said device having a transistor, wherein said first semiconductor region of one of said semiconductor devices in which information is written is connected to a power supply, and said first semiconductor region of one of said semiconductor devices in which no information is written is set in a floating state.

34. A device according to claim 23, wherein a transistor is provided for applying to said second electrode a voltage $V_2$ when information is read out from said storage device, wherein said voltage $V_2$ is lower than a voltage $V_1$ to be applied to said second electrode for writing information in said semiconductor device.

35. A device according to claim 23, wherein a semiconductor region having an impurity concentration higher than an impurity concentration of said first semiconductor region is arranged in contact with said first semiconductor region.

36. A device according to claim 30, wherein data to be written is written in said semiconductor device, and also is written in said DRAM, SRAM or flash memory, and wherein both written data are read out, and the two read-out results are collated with each other.

37. A device according to claim 31, wherein a circuit having a plurality of gate electrodes via floating gates is arranged in at least a portion of the peripheral circuit.

38. A device according to claim 32, wherein the card comprises a read-only storage device.

39. A device according to claim 32, wherein the card comprises a light-emitting element and a light-receiving element.

40. A device according to claim 34, wherein the following relations are satisfied:

$$\frac{C_{FG}}{C_{FG} + C_{CG}} V_1 > V_{BD}$$

$$\frac{C_{CG}}{C_{FG} + C_{CG}} V_2 < V_{th}$$

$$V_2 > V_{th}$$

where $V_{BD}$ is the voltage across said first and second electrodes when the resistance between said first and second electrodes changes from a high-resistance state to a low-resistance state, $V_{th}$ is the threshold value of an insulating gate transistor having said second and third semiconductor regions as main electrode regions, said first semiconductor region as a control electrode region, and said first electrode as a control electrode, $C_{FG}$ is the capacitance formed between said first electrode, and said first, second, and third semiconductor regions, and $C_{cd}$ is the capacitance formed between said first and second electrodes.

41. A device according to claim 36, wherein a region in which the collation result is written is provided in said semiconductor device.

42. A storage device having plural memory cells each of which comprises a first semiconductor region of one conductivity type, second and third semiconductor regions of a conductivity type opposite to the one conductivity type, which are contiguous to said first semiconductor region, a first electrode which is formed on and spaced from an isolating region for isolating said second and third semiconductor regions, said first electrode being spaced from the isolating region by a first insulating layer, and a second electrode formed on said first electrode and spaced from said first electrode by an insulating layer, wherein said plural memory cells include a memory cell having a high resistance between said first and second electrodes and a memory cell having a low resistance between said first and second electrodes.

43. A device according to claim 42, wherein said second semiconductor region of one of said plural memory cells and said third semiconductor region of an adjacent one of said plurality of storage devices are electrically connected to each other.

44. A device according to claim 42, wherein said memory cell is provided on a substrate which has an insulating layer.

45. A device according to claim 42, wherein said memory cells are arranged in a matrix, a wiring for commonly connecting the second electrodes in row direction of arrays is provided, the first semiconductor regions of said memory cells arranged in a column direction are commonly connected, and said first semiconductor regions in the respective arrays are electrically isolated from each other.

46. A device according to claim 42, including a memory cell wherein an opposing area between said first electrode and a semiconductor region having said first, second, and third semiconductor regions is larger than an opposing area of said second electrode and said first electrode.

47. A device according to claim 42, wherein said first electrode has at least two opposing potions which sandwich said first semiconductor region therebetween.

48. A device according to claim 42, wherein said first electrode comprises a material containing poly-Si.

49. A device according to claim 42, wherein an insulating layer between a semiconductor region including said first, second, and third semiconductor regions, and said first electrode comprises a film consisting of Si, N, and 0.

50. A device according to claim 42, wherein said storage device further comprises a DRAM, S RAM or flash memory.

51. A device according to claim 42, wherein a peripheral circuit of said memory cells comprises a CMOS circuit.

52. A device according to claim 42, wherein said storage device is mounted on a card.

53. A device according to claim 42, wherein a semiconductor region having an impurity concentration higher than an impurity concentration of said first semiconductor region is arranged in contact with said first semiconductor region.

54. A device according to claim 50, wherein data to be written is written in said storage device and in said DRAM, SRAM or flash memory, both written data are read out, and the two read-out results are collated to each other.

55. A device according to claim 51, wherein a circuit having a plurality of gate electrodes via floating gates is provided in at least a portion of the peripheral circuit.

56. A device according to claim 52, wherein the card comprises a read-only storage device.

57. A device according to claim 52, wherein the card comprises a light-emitting element and a light-receiving element.

58. A device according to claim 42, wherein the following relations are satisfied:
wherein $V_1$ is a voltage used for writing information, $V_2$ is a voltage used for reading written information, $V_{BD}$ is the voltage across said first and second electrodes when the resistance between said first and second electrodes changes from a high-resistance state to a low resistance state, $V_{th}$ is the threshold value of an insulating gate transistor having said second and third semiconductor regions as main electrode regions, said first semiconductor region as a control electrode region, and said first electrode as a control electrode, $C_{FG}$ is the capacitance formed between said first electrode, and said first, second and third semiconductor regions, and $C_{CG}$ is the capacitance formed between said first and second electrodes.

59. A device according to claim 54, wherein a region in which the collation result is written is provided in said storage device.

60. A semiconductor device having memory cells arranged in a matrix of plural rows and plural columns, wherein each cell comprises:
a first semiconductor region of a first conductivity type;
second and third semiconductor regions of a second conductivity type provided adjacent to said first conductivity region;
a first electrode provided on said first semiconductor region and spaced therefrom by a first insulating layer; and a second electrode provided on said first electrode and spaced therefrom by a second insulating layer, wherein said second electrodes of said memory cells arranged in each row are connected commonly, and independently electrically for each row, and wherein said first semiconductor regions of respective memory cells arranged in each column are connected commonly, and independently for each row electrically, and wherein a circuit is provided for applying predetermined different voltages to said second electrode and said first semiconductor region, so that the resistance between the first and second electrodes of a selected memory cell is changed from a high resistance state into a low resistance state.

61. A device according to claim 60, wherein said second and third semiconductor regions of memory cells of each column are connected serially.

62. A device according to claim 60, wherein said second and third semiconductor regions of the memory cells of each column are connected in parallel.

63. A semiconductor device having memory cells arranged in a matrix of plural rows and plural columns, wherein each cell comprises:
a first semiconductor region of a first conductivity type;
second and third semiconductor regions of a second conductivity type provided adjacent to said first conductivity region;
a first electrode provided on said first semiconductor region and spaced therefrom by a first insulating layer; and a second electrode provided on said first electrode and spaced therefrom by a second insulating layer, wherein said second electrodes of said memory cells arranged in each row are connected commonly, and independently electrically for each row, and wherein said first semiconductor regions of respective memory cells arranged in each column are connected commonly, and independently for each row electrically, and wherein one of said memory cells is at a lower resistance state at a section between its first and second electrodes than the resistance of the others, so that information is stored.

64. A device according to claim 61, wherein said second and third semiconductor regions of memory cells of each column are connected serially.

65. A device according to claim 61, wherein said second and third semiconductor regions of the memory cells of each column are connected in parallel.

66. A device according to claim 1, wherein plural said storage devices are provided, and wherein ones of said storage devices which are arranged adjacent to each other in a column or row direction share at least second or third semiconductor region respectively.

67. A device according to claim 1, wherein plural said storage devices are provided, and wherein ones of said storage devices which are arranged adjacent to each other in a column or row direction are connected serially.

* * * * *

UNITED STATES PATENT AND TRADEMARK OFFICE
CERTIFICATE OF CORRECTION

PATENT NO. : 5,808,336
DATED : September 15, 1998
INVENTOR(S) : MAMORU MIYAWAKI Page 1 of 3

It is certified that error appears in the above-identified patent and that said Letters Patent is hereby corrected as shown below:

Title Page, item [57] , "state is needed," should read --state, as needed--.

COLUMN 1

Line 40, "device-" should read --device--.
    Line 52, "and like" should read --and the like-- and "of the" should read --of-- and "integration" should read --integration,--.
    Line 57, "as the number of the times of use increases." should read --input/output operation is degraded with use.--.

COLUMN 2

Line ""but" should read --but--.

COLUMN 3

Line 22, "0." should read --O.--.
    Line 23, "yet" should read --yet still--.
    Line 61, "in the 13th storage device," should be deleted.
    Line 63, "in the 13th storage device," should be deleted.

UNITED STATES PATENT AND TRADEMARK OFFICE
CERTIFICATE OF CORRECTION

PATENT NO. :

5,808,336

DATED : September 15, 1998

INVENTOR(S) :

MAMORU MIYAWAKI

It is certified that error appears in the above-identified patent and that said Letters Patent is hereby corrected as shown below:

COLUMN 4

Line 21-22, "in the 18th storage device," should be deleted.

COLUMN 5

Line 44, "channel," should read --channel--.

COLUMN 7

Line 39, "decoder-2" should read --decoder--.

COLUMN 9

Line 52, "the n" should read --the n- --.
Line 53, "Overlagged" should read --Overlapped-- and "Dogged Drain" should read --Doped Drain--.

COLUMN 14

Line 22, "0$_2$" should read --O$_2$--.

COLUMN 23

Line 41, "0." should read --O.--.
Line 51, "device s" should read --devices--.

UNITED STATES PATENT AND TRADEMARK OFFICE
CERTIFICATE OF CORRECTION

PATENT NO. : 5,808,336
DATED : September 15, 1998
INVENTOR(S) : MAMORU MIYAWAKI Page 3 of 3

It is certified that error appears in the above-identified patent and that said Letters Patent is hereby corrected as shown below:

<u>COLUMN 25</u>

Line 5, "potions" should read --portions--.
    Line 12, "0." should read --O.--.
    Line 14, "S RAM" should read --SRAM--.
    Line 37-38, "satisfied:" should read
      --satisfied:

$$\frac{C_{FG}}{C_{FG} + C_{CG}} V_1 > V_{BD}$$

$$\frac{C_{FG}}{C_{FG} + C_{CG}} V_2 < V_{th}$$

$$V_2 > V_{th}$$

--.

Signed and Sealed this

Twenty-ninth Day of June, 1999

*Attest:*

Q. TODD DICKINSON

*Attesting Officer*     *Acting Commissioner of Patents and Trademarks*